(12) United States Patent
Lee et al.

(10) Patent No.: US 11,195,440 B2
(45) Date of Patent: Dec. 7, 2021

(54) DISPLAY DEVICE AND INSPECTING METHOD THEREFOR

(71) Applicant: SAMSUNG DISPLAY CO., LTD., Yongin-si (KR)

(72) Inventors: Kwang Sae Lee, Asan-si (KR); Jung Hoon Shim, Asan-si (KR); Won Kyu Kwak, Seongnam-si (KR); Ki Myeong Eom, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 104 days.

(21) Appl. No.: 15/987,268

(22) Filed: May 23, 2018

(65) Prior Publication Data
US 2018/0342185 A1    Nov. 29, 2018

(30) Foreign Application Priority Data
May 23, 2017  (KR) .................. 10-2017-0063587

(51) Int. Cl.
*G09G 3/00*  (2006.01)
*G01R 27/08*  (2006.01)
*G01R 31/28*  (2006.01)

(52) U.S. Cl.
CPC ............. *G09G 3/006* (2013.01); *G01R 27/08* (2013.01); *G01R 31/2818* (2013.01);
(Continued)

(58) Field of Classification Search
CPC .......... G09G 3/006; G09G 2300/0426; G09G 2330/12; G01R 27/08; G01R 31/2818; G01R 31/2825
See application file for complete search history.

(56) References Cited

U.S. PATENT DOCUMENTS 9,208,733 B2 * 12/2015 Al-Dahle ............ G09G 3/36
2008/0030725 A1 * 2/2008 Hachisuka ........... G01N 21/95
356/237.1

(Continued)

FOREIGN PATENT DOCUMENTS

KR    1020160097437    8/2016
KR    1020160129156    11/2016
KR    1020160139122    12/2016

*Primary Examiner* — Tung X Nguyen
*Assistant Examiner* — Feba Pothen
(74) *Attorney, Agent, or Firm* — F. Chau & Associates, LLC

(57) ABSTRACT

A display device includes a defect inspection circuit, and a display panel having a display area and a peripheral area positioned outside the display area. The display panel includes a sensing wire positioned in the peripheral area and connected to the defect inspection circuit. The defect inspection circuit includes a resistance detection circuit that detects a resistance of the sensing wire based on an output signal corresponding to the sensing wire, a memory that stores first resistance information related to the resistance of the sensing wire detected in a first inspection operation, and a comparator circuit including a first comparator that compares the first resistance information with second resistance information. The second resistance information is related to the resistance of the sensing wire detected in a second inspection operation that is performed at a different time than the first inspection operation.

21 Claims, 23 Drawing Sheets

(52) U.S. Cl.
CPC ............... *G01R 31/2825* (2013.01); *G09G 2300/0426* (2013.01); *G09G 2330/12* (2013.01)

(56) References Cited

U.S. PATENT DOCUMENTS

| | | | | |
|---|---|---|---|---|
| 2011/0063277 | A1* | 3/2011 | Menke | G06F 1/28 345/212 |
| 2011/0175800 | A1* | 7/2011 | Mizumaki | G09G 3/006 345/87 |
| 2013/0082843 | A1* | 4/2013 | Wurzel | G06F 1/1601 340/635 |
| 2017/0315672 | A1* | 11/2017 | Takahashi | G01R 27/26 |
| 2018/0053466 | A1* | 2/2018 | Zhang | G09G 3/20 |

\* cited by examiner

FIG. 8

| No | 0 | 1 | 2 | 3 | 4 | 5 | 6 | 7 | 8 | 9 | 10 | ... | 31 |
|---|---|---|---|---|---|---|---|---|---|---|---|---|---|
| Resistance (kΩ) | 150 | 155 | 160 | 165 | 170 | 175 | 180 | 185 | 190 | 195 | 200 | ... | 305 |

↓ Primary  ↓ Secondary

FIG. 9

| No | 0 | 1 | 2 | 3 | 4 | 5 | 6 | 7 | 8 | 9 | 10 | ... | 31 |
|---|---|---|---|---|---|---|---|---|---|---|---|---|---|
| Resistance comparison value (%) | 2 | 3 | 4 | 5 | 6 | 7 | 8 | 9 | 10 | 12 | 14 | ... | 200 |

↑   ↑
        Primary  Secondary

DISPLAY DEVICE AND INSPECTING METHOD THEREFOR

CROSS-REFERENCE TO RELATED APPLICATIONS

This application claims priority under 35 U.S.C. § 119 to Korean Patent Application No. 10-2017-0063587 filed on May 23, 2017, the entire disclosure of which is incorporated by reference herein in its entirety.

TECHNICAL FIELD

Exemplary embodiments of the present disclosure relate to a display device and a method of inspecting a display device for a defect.

DISCUSSION OF THE RELATED ART

A display device, such as a liquid crystal display (LCD) or an organic light emitting diode (OLED) display, includes a display panel including a plurality of pixels that display an image, and a plurality of signal lines. Each pixel may include a pixel electrode receiving a data signal. The pixel electrode may be connected to at least one transistor to receive the data signal. The display panel may include a plurality of stacked layers.

If the display panel receives an impact, a crack may be generated in a substrate or the stacked layers thereon. The crack may grow larger or spread to other layers or other regions over time, thereby causing a defect in the display panel. For example, when a crack is generated in the signal lines (e.g., in a data line or a scanning line), the signal lines may become disconnected, a resistance may increase, or moisture may penetrate the display panel through the crack.

A flexible display is a display that may be bent or warped while being manufactured and while being used. In this case, if a fine/micro crack exists in the substrate or the stacked layers of the display panel, even if there is no problem initially, the fine/micro crack may turn into a larger crack due to the warping or the bending of the display panel over time.

SUMMARY

Exemplary embodiments of the present disclosure provide a display device and a method of inspecting a display device for a defect in which the detection accuracy of the defect is increased.

According to an exemplary embodiment of the present disclosure, a display device includes a defect inspection circuit, and a display panel including a display area in which an image is displayed, and a peripheral area positioned outside the display area. The display panel includes at least one sensing wire positioned in the peripheral area and connected to the defect inspection circuit. The defect inspection circuit includes a resistance detection circuit that detects a resistance of the at least one sensing wire based on an output signal corresponding to the at least one sensing wire, a memory that stores first resistance information related to the resistance of the at least one sensing wire detected in a first inspection operation, and a comparator circuit including a first comparator that compares the first resistance information with second resistance information. The second resistance information is related to the resistance of the at least one sensing wire detected in a second inspection operation that is performed at a different time than the first inspection operation.

In an exemplary embodiment, the defect inspection circuit includes a pad portion that outputs a comparison result of the first comparator.

In an exemplary embodiment, the first resistance information and the second resistance information include a resistance value of the at least one sensing wire.

In an exemplary embodiment, the at least one sensing wire is one of a plurality of sensing wires, and the first resistance information and the second resistance information include a resistance comparison value between the plurality of sensing wires.

In an exemplary embodiment, the first resistance information and the second resistance information include a resistance value of the plurality of sensing wires.

In an exemplary embodiment, the comparator circuit further includes a second comparator that compares at least two resistances from among the plurality of sensing wires with each other to obtain the resistance comparison value.

In an exemplary embodiment, the plurality of sensing wires includes a first sensing wire and a second sensing wire positioned at a same side with respect to the display area.

In an exemplary embodiment, the plurality of sensing wires includes a first sensing wire and a second sensing wire positioned at opposite sides with respect to the display area.

In an exemplary embodiment, the plurality of sensing wires further includes a third sensing wire positioned at a same side with respect to the display area as the first sensing wire.

In an exemplary embodiment, at least one comparison result of the first comparator and the second comparator indicates a progress degree of a defect of the display device.

In an exemplary embodiment, the resistance detection circuit further includes a determining circuit that determines whether a detected resistance of the at least one sensing wire is within a first predetermined range, and that outputs a determination result indicating whether a defect is present in the display device.

According to an exemplary embodiment of the present disclosure, a display device includes a defect inspection circuit, and a display panel including a display area in which an image is displayed, and a peripheral area positioned outside the display area. The display panel includes a plurality of sensing wires positioned in the peripheral area and connected to the defect inspection circuit. The defect inspection circuit includes a resistance detection circuit that detects a resistance of each of the plurality of sensing wires based on a plurality of output signals corresponding to the plurality of sensing wires, and a comparator circuit including a first comparator that obtains a first resistance comparison value by comparing the resistances of the plurality of sensing wires with each other.

In an exemplary embodiment, the display device further includes a memory that stores the first resistance comparison value. The first resistance comparison value is obtained in a first inspection operation.

In an exemplary embodiment, the comparator circuit further includes a second comparator that compares the first resistance comparison value with a second resistance comparison value. The second resistance comparison value is obtained in a second inspection operation performed at a different time than the first inspection operation.

In an exemplary embodiment, the resistance detection circuit includes a pad portion that outputs an output signal of the comparator circuit.

In an exemplary embodiment, the display panel further includes a voltage transmitting line positioned in the peripheral area. The voltage transmitting line transmits a common voltage. The plurality of sensing wires includes a first sensing wire positioned between the voltage transmitting line and the display area, and a first end and a second end of the first sensing wire are connected to the resistance detection circuit.

In an exemplary embodiment, the peripheral area of the display panel includes a bending region that is bent or bendable. The plurality of sensing wires includes a first sensing wire extending along a periphery of the display area, and a second sensing wire including a portion that is positioned at the bending region and that is shorter than the first sensing wire. The second sensing wire detects a defect in the bending region. A first end and a second end of the first sensing wire are connected to the resistance detection circuit. A first end and a second end of the second sensing wire are connected to the resistance detection circuit.

In an exemplary embodiment, the display device further includes a voltage transmitting line positioned in the peripheral area. The voltage transmitting line transmits a common voltage. The first sensing wire and the second sensing wire are positioned in a same layer as the voltage transmitting line in the bending region.

In an exemplary embodiment, the second sensing wire is positioned between an edge of the display panel and the first sensing wire in the bending region.

According to an exemplary embodiment of the present disclosure, a method of inspecting a display device for a defect includes storing, in a resistance detection circuit, first resistance information related to a resistance of at least one sensing wire. The first resistance information is obtained in a first inspection operation, the display device includes a display panel including a display area in which an image is displayed and a peripheral area positioned outside the display area, and the at least one sensing wire is disposed in the peripheral area of the display panel and is connected to the resistance detection circuit. The method further includes obtaining, by the resistance detection circuit, second resistance information related to the resistance of the at least one sensing wire. The second resistance information is obtained in a second inspection operation performed at a different time than the first inspection operation. The method further includes comparing, by the resistance detection circuit, the first resistance information with the second resistance information.

In an exemplary embodiment, the first resistance information and the second resistance information include a resistance value of the at least one sensing wire.

In an exemplary embodiment, the at least one sensing wire is one of a plurality of sensing wires, and the first resistance information and the second resistance information include a resistance comparison value between the plurality of sensing wires.

In an exemplary embodiment, the method further includes obtaining the resistance comparison value in the first inspection operation or the second inspection operation by comparing at least two resistances from among the plurality of sensing wires.

In an exemplary embodiment, the method further includes determining a progress degree of the defect of the display device by comparing at least two resistances corresponding to the at least one sensing wire.

According to exemplary embodiments of the present disclosure, it is possible to improve accuracy regarding the inspection for a defect (e.g., a crack) generated in the display device, to decrease erroneous defect detection, and to accurately determine progress degree of the defect. According to exemplary embodiments, inspection accuracy regarding a defect such as a crack of the display panel may be increased regardless of a wire width deviation by process dispersion in the manufacturing process.

BRIEF DESCRIPTION OF THE DRAWINGS

FIG. 8 and FIG. 9 are tables showing an example of storing a result of a first inspection operation and a second inspection operation in a method of inspecting a display device for a defect such as a crack, according to an exemplary embodiment of the present disclosure.

DETAILED DESCRIPTION OF THE EXEMPLARY EMBODIMENTS

Figure 1:
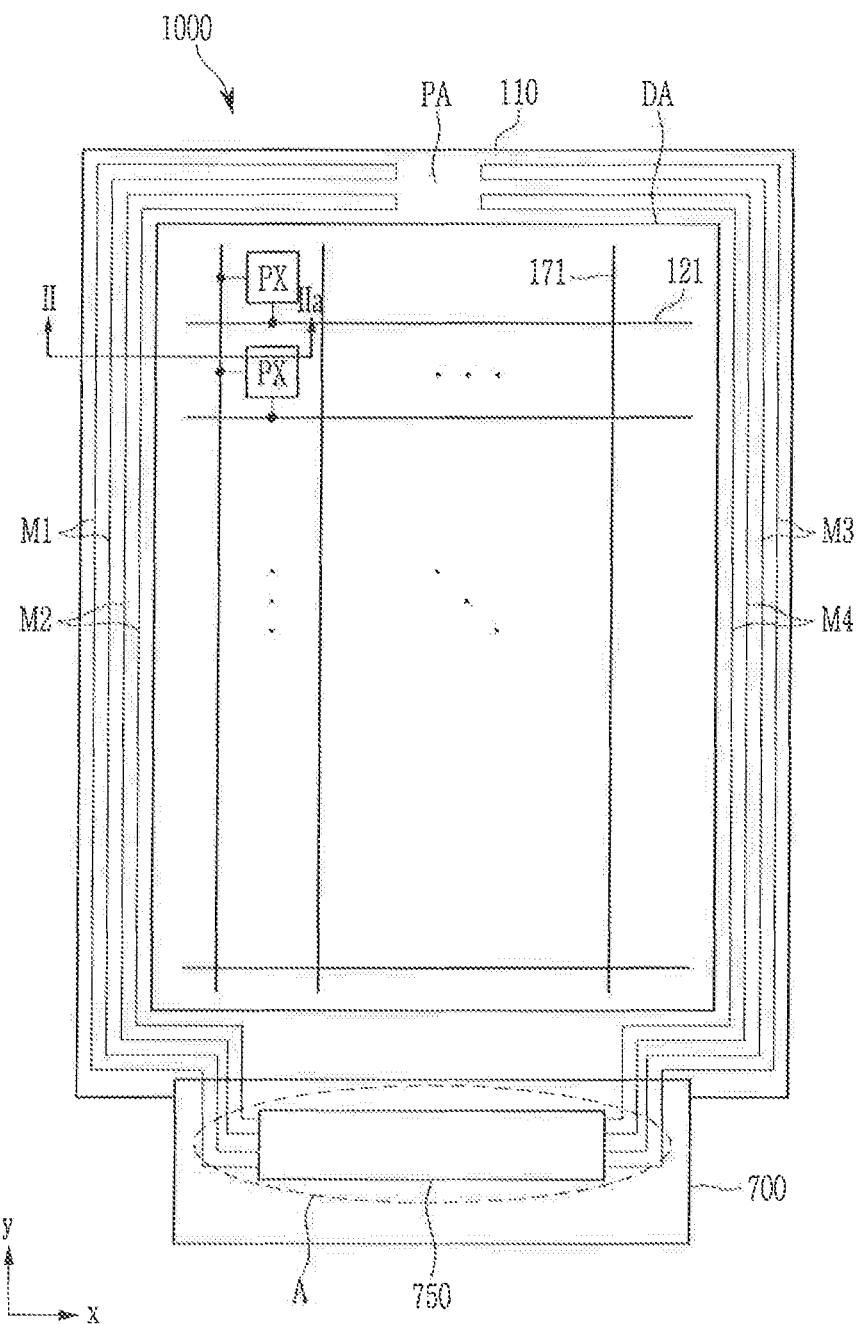
FIG. 1 is a layout view of a display device, according to an exemplary embodiment of the present disclosure.

Exemplary embodiments of the present disclosure will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present.

It will be further understood that the terms "first", "second", "third", etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. Further, when two components or directions are described as extending substantially parallel or substantially perpendicular to each other, the two components or directions extend exactly parallel or perpendicular to each other, or extend approximately parallel or perpendicular to each other as would be understood by a person having ordinary skill in the art.

As is traditional in the field of the present disclosure, exemplary embodiments are described, and illustrated in the drawings, in terms of functional blocks, units, and/or modules. Those skilled in the art will appreciate that these blocks, units, and/or modules are physically implemented by electronic circuits such as logic circuits, discrete components, microprocessors, hard-wired circuits, memory elements, wiring connections, etc., which may be formed using semiconductor-based fabrication techniques or other manufacturing technologies. In the case of the blocks, units, and/or modules being implemented by microprocessors or similar, they may be programmed using software (e.g., microcode) to perform various functions discussed herein and may optionally be driven by firmware and/or software. Alternatively, each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of the exemplary embodiments may be physically separated into two or more interacting discrete blocks, units, and/or modules without departing from the scope of the present disclosure. Further, the blocks, units, and/or modules of the exemplary embodiments may be physically combined into more complex blocks, units, and/or modules without departing from the scope of the present disclosure.

A display device according to an exemplary embodiment of the present disclosure will be described with reference to FIG. 1 to FIG. 5. A plane structure of the display device is first described with reference to FIG. 1. A cross-sectional structure of the display device is then described with reference to FIG. 2.

Referring to FIG. 1, the display device according to an exemplary embodiment includes a display panel 1000 including a display area DA and a peripheral area PA, and a circuit unit 750 (also referred to as a defect inspection circuit 750).

The display area DA includes a plurality of pixels PX and a plurality of signal lines disposed on a plane having an x direction and a y direction. In the present disclosure, a structure observed when viewing in a direction substantially perpendicular to the x direction and the y direction is referred to as a plane structure, and a structure observed when cut along the direction substantially perpendicular to the x direction and the y direction is referred to as a cross-sectional structure.

The signal lines include a plurality of gate lines 121 that transmit a gate signal and a plurality of data lines 171 that transmit a data signal. The gate lines 121 extend in the x direction, and the data lines 171 extend in the y direction, thereby crossing the gate lines 121.

Each pixel PX may include at least one switching element and a pixel electrode connected thereto. The switching element may be implemented as a three-terminal element such as a transistor integrated with the display panel 1000, and may be connected to at least one gate line 121 and at least one data line 171. The switching element is turned on or turned off according to the gate signal transmitted by the gate line 121, thereby selectively transmitting the data signal to the pixel electrode.

To implement a color display, each pixel PX may display one of predetermined colors, and an image of a desired color may be recognized by combining images displayed by the predetermined colors. An example of the predetermined colors displayed by the plurality of pixels PX may be three primary colors of red, green, and blue, or three primary colors of yellow, cyan, and magenta. At least one different color such as white may be further included as well as the three primary colors.

The display panel 1000 includes a substrate 110 in which the pixels PX and the signal lines are formed. The substrate 110 may include, for example, glass, plastic, etc. The display panel 1000 may be a flexible display panel. For example, the substrate 110 may be composed of various plastics such as PET, PEN, PC, PAR, PEI, PES, or PI, a metal thin film, or glass.

The peripheral area PA is positioned outside the display area DA, and surrounds a periphery of the display area DA.

The peripheral area PA may include a plurality of sensing wires M1, M2, M3, and M4. The plurality of sensing wires M1, M2, M3, and M4 are wires used to sense defects such as, for example, cracks, or lifting generated in the peripheral area PA of the display panel 1000. The defects may be sensed through, for example, wire resistance detection. FIG. 1 shows an example in which a pair of sensing wires M1 and M2 are positioned at a left side and a pair of sensing wires M3 and M4 are positioned at a right side with respect to the display area DA. However, exemplary embodiments of the present disclosure are not limited thereto.

According to exemplary embodiments, each wire of the sensing wires M1, M2, M3, and M4 is positioned on only one layer, or is formed by electrically connecting portions positioned at different layers from each other.

Both ends of each of the sensing wires M1, M2, M3, and M4 is connected to the circuit unit 750. For example, both ends of each of the sensing wires M1, M2, M3, and M4 are connected at the same side of the circuit unit 750. Each of the sensing wires M1, M2, M3, and M4 starts from one end, extends along a left or right edge of the display area DA, and then is curved to again return, thereby having a reciprocating structure (or a meandering shape). For example, in exemplary embodiments, each of the sensing wires M1, M2, M3, and M4 moves alternately back and forth (e.g., reciprocates) between extending in the x direction and the y direction. A number of reciprocations of one reciprocating structure may be one as shown in the drawing, or may be plural. Further, at least one sensing wire from among the plurality of sensing wires M1, M2, M3, and M4 may have a plurality of reciprocating structures.

Each of the sensing wires M1, M2, M3, and M4 may include a portion extending along the left or right edge of the display area DA as shown in FIG. 1, and a portion extending along an upper edge of the display area DA. That is, each of the sensing wires M1, M2, M3, and M4 extends in the y direction along the left or right edge of the display area DA (the wire may reciprocate several times in the y direction in this portion), and extends in the x direction along the upper edge of the display area DA (the wire may reciprocate several times in the x direction in this portion) after folding in the direction near a corner of the display panel 1000, and the direction may be folded on a center portion of the upper edge of the display area DA to return. Alternately, each of the sensing wires M1, M2, M3, and M4 may only include a portion extending along the left or right edge of the display area DA and may not be positioned on the upper edge of the display area DA.

A pair of sensing wires M1 and M2 or M3 and M4 positioned in the peripheral area PA of one side with respect to the display area DA may include portions extending to be substantially parallel to each other in the peripheral area PA, and one of the sensing wires M2 and M4 may be positioned between one of the other sensing wires M1 and M3 and the display area DA. Both ends of a pair of sensing wires M1 and M2 or M3 and M4 positioned in the peripheral area PA of one side with respect to the display area DA may be connected to the same side of the circuit unit 750. Here, the same side of the circuit unit 750 means one edge extending in a predetermined direction as shown in FIG. 1, or means one edge toward the predetermined direction when distinguishing the edge as the direction of the edge of the circuit unit 750.

Wire resistances of the sensing wires M1, M2, M3, and M4 may be different from or similar to each other. For example, in an exemplary embodiment, the wire resistances of the sensing wires M2 and M4 placed closer to the display area DA are about equal to or smaller than the wire resistances of the sensing wires M1 and M3 placed closer to the edge of the display panel 1000.

The number of reciprocations of the reciprocating structure included in at least one sensing wire from among the plurality of sensing wires M1, M2, M3, and M4 may be equal to or different from the number of reciprocations of the reciprocating structure included in other sensing wires M1, M2, M3, and M4. For example, in an exemplary embodiment, the number of reciprocations of the reciprocating structure included in the sensing wires M1 and M3 positioned further outward relative to the display area DA is smaller than the number of reciprocations of the reciprocating structure included in the sensing wires M2 and M4 positioned closer to the display area DA. Accordingly, since the region occupied by the sensing wires M2 and M4 is partially reduced, a bezel of the display panel 1000 may be reduced by reducing the size of the peripheral area PA, and a deviation of a wire length depending on the positions of the sensing wires M1, M2, M3, and M4 may be compensated.

In exemplary embodiments, the sensing wires M1, M2, M3, and M4 are positioned on the same layer on a cross-section, include the same material, and are formed by being simultaneously patterned in the same manufacturing process. In this case, the plurality of sensing wires M1, M2, M3, and M4 may have a similar wire width deviation under an influence of the same or equal process distribution.

When there is a difference between the wire resistances of the sensing wires M1, M2, M3, and M4, a matching resistor to compensate the resistance deviation of the sensing wires M1, M2, M3, and M4 having a large difference may be further included in exemplary embodiments.

In an exemplary embodiment, when detecting a defect such as, for example, a crack, at least one wire resistance from among the plurality of sensing wires M1, M2, M3, and M4 is used as a reference resistance value to compare the wire resistances of the other sensing wires M1, M2, M3, and M4 with each other.

In an exemplary embodiment, a gate driver connected to the plurality of gate lines 121, which applies the gate signal, is further positioned in the peripheral area PA.

In an exemplary embodiment, the peripheral area PA further includes a bending region in which the display panel 1000 is bent or is bendable. In this case, when the display panel 1000 is unfolded on a plane by releasing the bending state, the bending region is positioned between the display area DA and the circuit unit 750. The bending region will be described in further detail below.

In an exemplary embodiment, the circuit unit 750 is positioned at a printed circuit film 700 connected to the peripheral area PA of the display panel 1000, as shown in FIG. 1. Alternatively, in an exemplary embodiment, the circuit unit 750 is directly mounted on the peripheral area PA of the display panel 1000, or is formed on the substrate 110 along with constituent elements such as, for example, a transistor of the pixel PX. A data driver that generates the data signal to drive the pixel PX, and a timing controller may be further positioned in the printed circuit film 700, The circuit unit 750 may be, for example, an integrated circuit (IC) chip.

Figure 2:
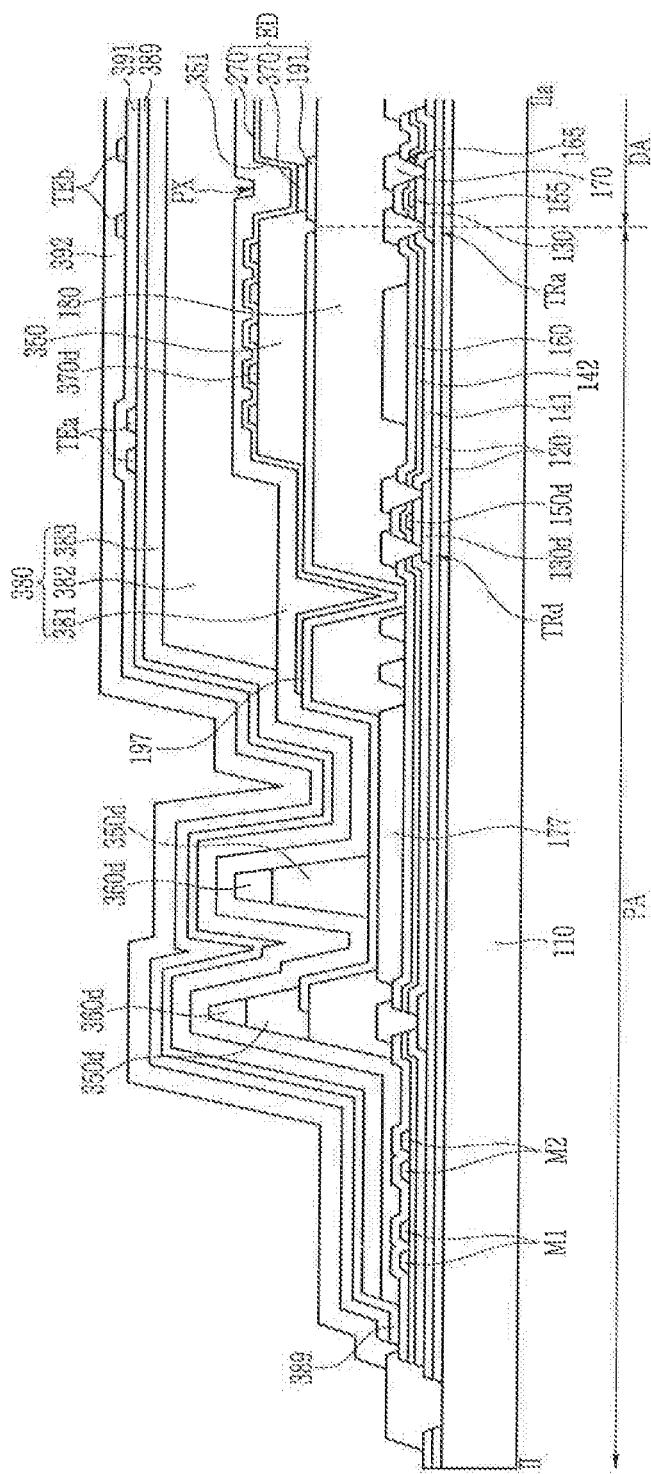
FIG. 2 is a cross-sectional view of the display device shown in FIG. 1 taken along line II-IIa, according to an exemplary embodiment of the present disclosure.

In an exemplary embodiment, the circuit unit 750 includes a plurality of pad portions connected to each end of the sensing wires M1, M2, M3, and M4 or bonded to a pad portion connected to each end of the sensing wires M1, M2, M3, and M4. As shown in FIG. 2, in an exemplary embodiment, these pad portions are positioned at a location in which the sensing wires M1, M2, M3, and M4 and the circuit unit 750 meet.

In an exemplary embodiment in which the circuit unit 750 is positioned at the printed circuit film 700, the sensing wires M1, M2, M3, and M4 extend to the printed circuit film 700. In this case, the sensing wires M1, M2, M3, and M4 may include a wire positioned at the display panel 1000 and a wire positioned at the printed circuit film 700 connected to the wire of the display panel 1000.

A cross-sectional structure of the display device according to an exemplary embodiment of the present disclosure will now be described with reference to FIG. 2 along with FIG. 1.

Referring to FIG. 2, in an exemplary embodiment, a barrier layer 120 may be positioned on a substrate 110. The barrier layer 120 may include a plurality of layers, or may be a single layer as shown in FIG. 2.

An active pattern is positioned on the barrier layer 120. The active pattern may include an active pattern 130 positioned in the display area DA and an active pattern 130d positioned in the peripheral area PA. Each of the active patterns 130 and 130d may include a source region and a drain region, and a channel region positioned therebetween. The active pattern may include, for example, amorphous silicon, polysilicon, or an oxide semiconductor.

A first insulating layer 141 may be positioned on the active patterns 130 and 130d, and a first conductive layer may be positioned on the first insulating layer 141. The first conductive layer may include a conductor 155 overlapping the active pattern 130 positioned in the display area DA, a conductor 150d overlapping the active pattern 130d positioned in the peripheral area PA, and the plurality of above-described gate lines 121.

The active pattern 130 and the conductor 155 overlapping thereto together form a transistor TRa, and the active pattern 130d and the conductor 150d overlapping thereto together form a transistor TRd. The transistor TRa may function as a switching element included in the pixel PX positioned in the display area DA, and the transistor TRd may function as a switching element included in the gate driver.

A second insulating layer 142 may be positioned on the first conductive layer and the first insulating layer 141, and a second conductive layer may be positioned on the second insulating layer 142. The second conductive layer may include at least one of sensing wires M1, M2, M3, and M4, but is not limited thereto. At least one sensing wire from among the sensing wires M1, M2, M3, and M4 may be positioned in a conductive layer other than the second conductive layer.

A third insulating layer 160 may be positioned on the second conductive layer and the second insulating layer 142.

At least one layer from among the first insulating layer 141, the second insulating layer 142, and the third insulating layer 160 may include an inorganic insulating material such as, for example, a silicon nitride (SiNx), a silicon oxide (SiOx), and/or an organic insulating material.

The first insulating layer 141, the second insulating layer 142, and the third insulating layer 160 may include a contact hole 165 positioned at the source region and/or the drain region of the transistors TRa and TRd.

A third conductive layer may be positioned on the third insulating layer 160. The third conductive layer may include a conductor 170 connected to the source region or the drain region of the transistors TRa and TRd through the contact hole 165, a voltage transmitting line 177, and the above-described data line 171. The voltage transmitting line 177 may be positioned in the peripheral area PA, and may transmit a predetermined voltage such as, for example, a common voltage ELVSS.

At least one layer from among the first conductive layer, the second conductive layer, and the third conductive layer may include a conductive material such as, for example, copper (Cu), aluminum (Al), molybdenum (Mo), titanium (Ti), tantalum (Ta), and alloys of at least two of these materials.

A passivation layer 180 is positioned on the third conductive layer and the third insulating layer 160. The passivation layer 180 may include an inorganic insulating material and/or an organic insulating material such as, for example, a polyacrylic resin and a polyimide-based resin. An upper surface of the passivation layer 180 may be substantially flat. The passivation layer 180 may include a contact hole positioned on the voltage transmitting line 177 positioned in the peripheral area PA.

A pixel electrode layer is positioned on the passivation layer 180. The pixel electrode layer may include a pixel electrode 191 corresponding to each pixel PX of the display area DA, and a voltage transmitting electrode 197 positioned in the peripheral area PA. The voltage transmitting electrode 197 may be physically and electrically connected to the voltage transmitting line 177 through a contact hole of the passivation layer 180, thereby transmitting the common voltage ELVSS.

The pixel electrode layer may include, for example, a semi-transmissive conductive material or a reflective conductive material.

A pixel definition layer 350 is positioned on the passivation layer 180 and the pixel electrode layer. The pixel definition layer 350 may have an opening 351 formed on the pixel electrode 191, and may further include at least one dam portion 350d positioned at the peripheral area PA. The dam portion 350d may extend to be substantially parallel to the edge of the substrate 110 on a plane. A spacer 360d may be positioned on the dam portion 350d.

Referring to FIG. 2, at least one of the sensing wires M1, M2, M3, and M4 may be positioned outside relative to the dam portion 350d. However, the location of the at least one of the sensing wires M1, M2, M3, and M4 is not limited thereto. For example, in an exemplary embodiment, at least one sensing wire from among the sensing wires M1, M2, M3, and M4 may be positioned inside relative to the dam portion 350d.

The voltage transmitting electrode 197 includes a portion that is not covered by the pixel definition layer 350.

The pixel definition layer 350 may include a photosensitive material such as, for example, a polyacrylic resin and a polyimide-based resin.

An emission layer 370 is positioned on the pixel electrode 191. The emission layer 370 may include a portion positioned in the opening 351 of the pixel definition layer 350. The emission layer 370 may further include at least one dummy emission layer 370d positioned in the peripheral area PA and positioned on the pixel definition layer 350. The emission layer 370 may include, for example, an organic emission material or an inorganic emission material.

A common electrode 270 is positioned on the emission layer 370. The common electrode 270 is also formed on the pixel definition layer 350. Thus, the common electrode 270 may be continuously formed throughout the plurality of pixels PX. The common electrode 270 may be physically and electrically connected to the voltage transmitting electrode 197 in the peripheral area PA, thereby receiving the common voltage ELVSS. The common electrode 270 may include, for example, a conductive transparent material.

The pixel electrode 191, the emission layer 370, and the common electrode 270 of each pixel PX together form a light emitting diode (LED) ED, one of the pixel electrode 191 and the common electrode 270 functions as a cathode, and the other one of the pixel electrode 191 and the common electrode 270 functions as an anode.

An encapsulating portion 380 that protects and encapsulates the light emitting diode (LED) ED may be positioned on the common electrode 270. The encapsulating portion 380 includes at least one of inorganic layers 381 and 383 and at least one organic layer 382. The at least one of the inorganic layers 381 and 383 and the at least one organic layer 382 may be alternately stacked. The organic layer 382 includes the organic material, thereby having a flattening characteristic. The inorganic layers 381 and 383 may include an inorganic material such as, for example, an aluminum oxide (AlOx), a silicon oxide (SiOx), a silicon nitride (SiNx), and a silicon oxynitride (SiON).

Since a plane area of the organic layer 382 is wider than a plane area of the inorganic layers 381 and 383, the two inorganic layers 381 and 383 may be in contact with each other in the peripheral area PA. The inorganic layer 381 positioned at the bottom of the inorganic layers 381 and 383 may be in contact with the upper surface of the third insulating layer 160 in the peripheral area PA. However, exemplary embodiments of the present disclosure are not limited thereto.

The edge of the organic layer 382 included in the encapsulating portion 380 may be positioned between the dam portion 350d and the display area DA. The dam portion 350d may function to prevent the organic material from overflowing to the outside when forming the organic layer 382 of the encapsulating portion 380.

In an exemplary embodiment, a buffer layer 389 including the inorganic insulating material and/or the organic insulating material is positioned on the encapsulating portion 380. In an exemplary embodiment, the buffer layer 389 is not present.

A fourth conductive layer may be positioned on the buffer layer 389. The fourth conductive layer may include a first touch conductor TEa. A first touch insulating layer 391 may be positioned on the fourth conductive layer, and a fifth conductive layer may be positioned thereon. The fifth conductive layer may include a second touch conductor TEb. A second touch insulating layer 392 may be positioned on the fifth conductive layer. The first touch conductor Tea and the second touch conductor TEb form a capacitive touch sensor. Thus, if a touch of an external object is generated, touch information such as, for example, touch existence, a touch position, etc. may be sensed.

Figure 3:
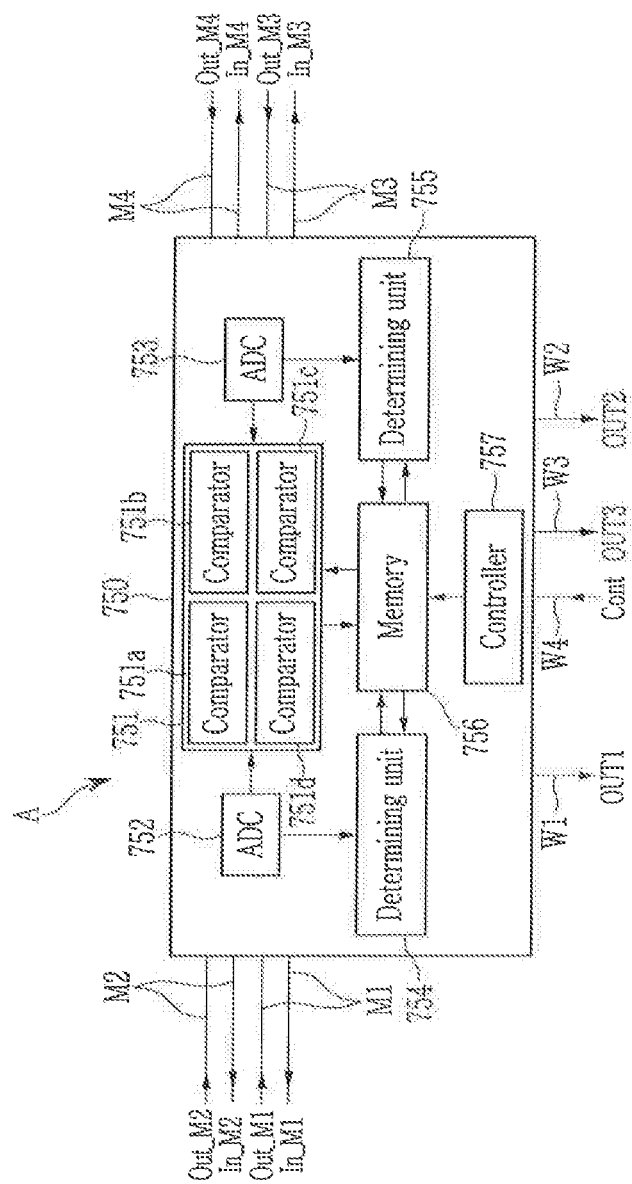
FIG. 3 is an enlarged view of portion A of the display device shown in FIG. 1, according to an exemplary embodiment of the present disclosure.
Figure 4:
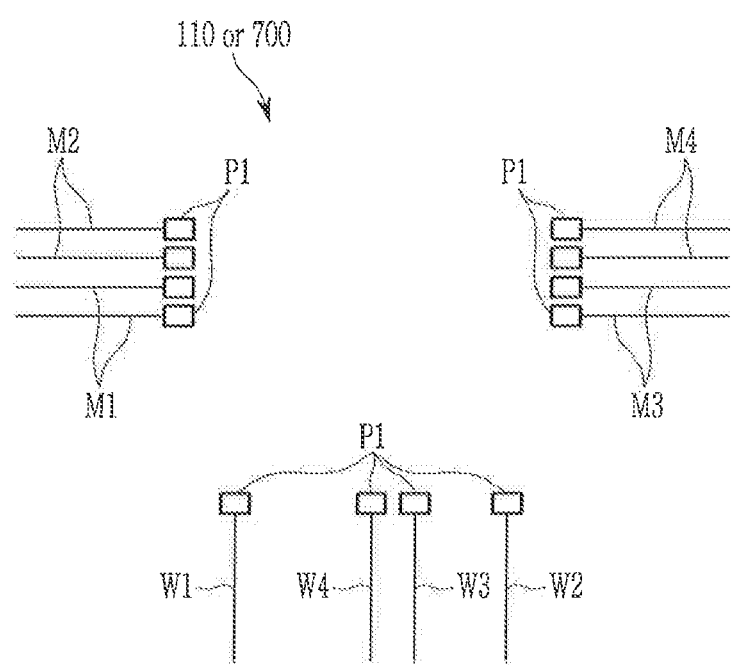
FIG. 4 is a plane layout view of a sensing wire and an end of a signal wire positioned at portion A of the display device shown in FIG. 1, according to an exemplary embodiment of the present disclosure.
Figure 5:
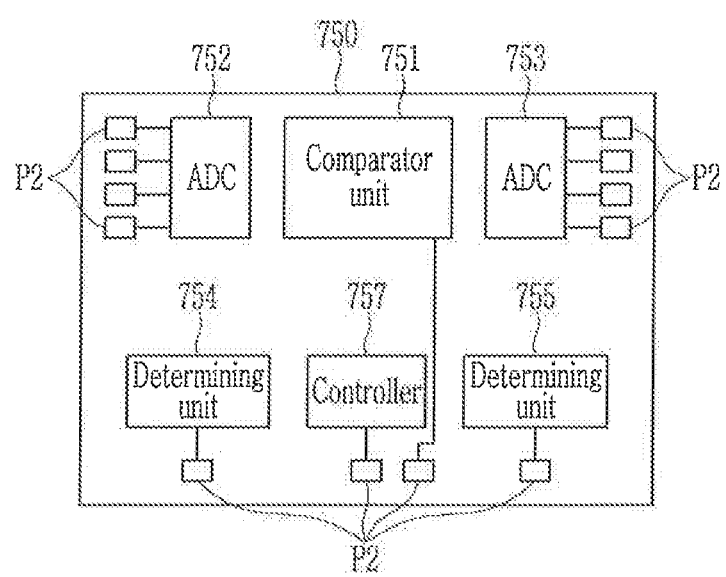
FIG. 5 is a plane layout view showing an arrangement of pad portions of a circuit unit of the display device shown in FIG. 1, according to an exemplary embodiment of the present disclosure.

FIG. 3 is an enlarged view of portion A of the display device shown in FIG. 1. FIG. 4 is a plane layout view of a sensing wire and an end of a signal wire positioned at portion A of the display device shown in FIG. 1. FIG. 5 is a plane layout view showing an arrangement of pad portions of a circuit unit of the display device shown in FIG. 1.

Referring to FIG. 3, in an exemplary embodiment, the circuit unit 750 inputs input signals In_M1, In_M2, In_M3, and In_M4 as defect test signals, which are used to detect defects such as a crack, to one end of each of the sensing wires M1, M2, M3, and M4. Further, the circuit unit 750 receives output signals Out_M1, Out_M2, Out_M3, and Out_M4 from the other end of sensing wires M1, M2, M3, and M4. Output signal Out_M1 corresponds to sensing wire M1, output signal Out_M2 corresponds to sensing wire M2, output signal Out_M3 corresponds to sensing wire M3, and output signal Out_M4 corresponds to sensing wire M4.

In an exemplary embodiment, the circuit unit 750 includes a comparator unit 751 (also referred to as a comparator circuit 751), a plurality of resistance detection units 752 and 753 (also referred to as a plurality of resistance detection circuits 752 and 753), a plurality of determining units 754 and 755 (also referred to as a plurality of determining circuits 754 and 755), a memory 756, and a controller 757 (also referred to as a controller circuit 757).

FIG. 3 shows an exemplary embodiment in which the circuit unit 750 includes a pair of resistance detection units 752 and 753 respectively corresponding to the left sensing wires M1 and M2 and the right sensing wires M3 and M4. However, the number of resistance detection units is not limited thereto. For example, in an exemplary embodiment, the number of resistance detection units may be the same as the number of sensing wires M1, M2, M3, and M4 connected to the circuit unit 750. In an exemplary embodiment, one resistance detection unit may be provided for all sensing wires M1, M2, M3, and M4.

In the exemplary embodiment shown in FIG. 3, the resistance detection unit 752 detects the resistance of the sensing wires M1 and M2 based on the output signals Out_M1 and Out_M2 of the sensing wires M1 and M2, and the resistance detection unit 753 detects the resistance of the sensing wires M3 and M4 based on the output signals Out_M3 and Out_M4 of the sensing wires M3 and M4. In exemplary embodiments, the resistance detection units 752 and 753 respectively include at least one analog-to-digital converter (ADC), which converts the output signals Out_M1, Out_M2, Out_M3, and Out_M4 from the sensing wires M1, M2, M3, and M4 to a digital value. The resistance detection units 752 and 753 output each detected resistance of the sensing wires M1, M2, M3, and M4 to the comparator unit 751 and the determining units 754 and 755. The resistance detection units 752 and 753 transmit the detected resistances of the sensing wires M1, M2, M3, and M4 to the memory 756, and the memory 756 stores the detected resistances.

FIG. 3 shows an exemplary embodiment in which the circuit unit 750 includes a pair of determining units 754 and 755 respectively corresponding to the resistance detection units 752 and 753. However, the number of determining units 754 and 755 is not limited thereto. For example, in an exemplary embodiment, the number of determining units may be the same as the number of sensing wires M1, M2, M3, and M4 connected to the circuit unit 750. In an exemplary embodiment, one determining unit may be provided for both resistance detection units 752 and 753.

The determining unit 754 determines whether each resistance of the sensing wires M1 and M2 input from the resistance detection unit 752 is within a first predetermined range, and outputs the determined result. The determining unit 755 determines whether each resistance of the sensing wires M3 and M4 input from the resistance detection unit 753 is within the first predetermined range, and outputs the determined result. The determined result of the determining units 754 and 755 may be included in the output signals OUT1 and OUT2, and thus, may be output outside the circuit unit 750 (e.g., the determined results may be transmitted to a device external to the circuit unit 750). The resistance of the sensing wires M1, M2, M3, and M4 may be stored in the memory 756 depending on the determined result of the determining units 754 and 755.

The determining unit 754 is connected to the signal wire W1 positioned at the substrate 110 or the printed circuit film 700, and outputs the output signal OUT1 to the signal wire W1. The determining unit 755 is connected to the signal wire W2 positioned at the substrate 110 or the printed circuit film 700, and outputs the output signal OUT2 to the signal wire W2.

In the exemplary embodiment of FIG. 3, the comparator unit 751 includes a plurality of comparators 751a, 751b, 751c, and 751d. FIG. 3 shows an exemplary embodiment in which the comparator unit 751 includes four comparators 751a, 751b, 751c, and 751d. However, the number of comparators is not limited thereto.

The comparator 751a compares the resistance of the sensing wire M1 and the resistance of the sensing wire M2 detected by the resistance detection unit 752 with each other, and outputs the determined result. The comparator 751b compares the resistance of the sensing wire M3 and the resistance of the sensing wire M4 detected by the resistance detection unit 753 with each other, and outputs the determined result. The comparator 751c compares the resistance of the sensing wire M1 or the sensing wire M2 detected by the resistance detection unit 752 with the resistance of the sensing wire M3 or the sensing wire M4 detected by the resistance detection unit 753, and outputs the determined result. For example, in an exemplary embodiment, the comparator 751c compares the resistance of the sensing wire M1 or M2 positioned in the peripheral area PA of one side (e.g., the left side) with respect to the display area DA with the resistance of the sensing wire M3 or M4 positioned at the other side (e.g., the right side), and outputs the determined result.

In an exemplary embodiment, the comparator 751d compares the results of a plurality of inspection operations, which will be described further below, with each other, and outputs the determined result. The comparator 751d receives the result of each inspection operation from the memory 756. The comparison result of the comparator unit 751 including the comparison result of the comparator 751d may be included in the output signal OUT3 to be output outside the circuit unit 750, and may be transmitted to and stored in the memory 756.

The comparator unit 751 is connected to the signal wire W3 positioned at the substrate 110 or the printed circuit film 700, and outputs the output signal OUT3 to the signal wire W3.

The controller 757 receives an input control signal Cont from the outside (e.g., from a source disposed external to the circuit unit 750), and uses the input control signal Cont to control each part of the circuit unit 750. For example, the control signal Cont may be used to configure the settings of the memory 756. The controller 757 is connected to the signal wire W4 positioned at the substrate 110 or the printed circuit film 700, and receives the input control signal Cont from the outside. Alternatively, the controller 757 may be positioned outside the circuit unit 750.

Referring to FIG. 4, the sensing wires M1, M2, M3, and M4, and the signal wires W1, W2, W3, and W4 positioned at the substrate 110 or the printed circuit film 700 may include pad portions P1 that function as terminals positioned at the end of the wires. The pad portion P1 may be positioned at the same layer and made of the same material as the sensing wires M1, M2, M3, and M4 and the signal wires W1, W2, W3, and W4. Alternatively, the pad portion P1 may be positioned at different layers.

Referring to FIG. 5, in an exemplary embodiment, the circuit unit 750 includes a plurality of pad portions P2 that function as terminals connected to the pad portions P1. The pad portions P2 of the circuit unit 750 may be disposed to respectively correspond to the pad portions P1, and the pad portions P2 and the pad portions P1 may be electrically bonded to each other through various bonding methods. The pad portions P2 of the circuit unit 750 may be respectively connected to the resistance detection units 752 and 753, the determining units 754 and 755, the comparator unit 751, and the controller 757.

According to an exemplary embodiment, instead of positioning a plurality of sensing wires in the peripheral area PA at one side of the display area DA, only one sensing wire is positioned in the peripheral area PA at one side of the display area DA. For example, in an exemplary embodiment, one of the sensing wires M1 and M2 shown in FIG. 1 and FIG. 2 may be omitted, one of the sensing wires M3 and M4 may be omitted, or one of the sensing wires M1 and M2 and one of the sensing wires M3 and M4 may be omitted. In this case, at least one of two comparators 751a and 751b may be omitted, and the pad portions P1 and P2 connected to the omitted sensing wire may be omitted. Furthermore, the comparator 751c of the comparator unit 751 may be omitted, thereby only including the comparator 751d. In this case, the comparator 751d may compare the results of the plurality of inspection steps executed at different times with each other to determine a progress degree of a defect such as a crack, and the determined result of the progress and the progress degree may be included in the output signal OUT3 to be output. A progress degree indicates whether a defect such as a crack is getting worse.

According to an exemplary embodiment, the sensing wire may be positioned at only one side of the display area DA in the exemplary embodiment shown in FIG. 1. For example, referring to FIG. 1, in an exemplary embodiment, the sensing wires M1 and M2 may be omitted or the sensing wires M3 and M4 may be omitted. In this case, one of the two comparators 751a and 751b and the comparator 751c may be omitted, and the pad portions P1 and P2 connected to the omitted sensing wire may be omitted. Furthermore, only one sensing wire may be positioned in the peripheral area PA positioned on one side of the display area DA. In this case, the comparator unit 751 may only include the comparator 751d, and the comparator 751d may compare the results of the plurality of inspection steps executed at different times with each other to determine the progress and the progress degree of a defect such as a crack.

According to an exemplary embodiment, when it is not necessary to output the determined result of the determining units 754 and 755 to the outside (e.g., to a location external to the circuit unit 750), the signal wires W1 and W2 and the pad portion P2 of the circuit unit 750 may be omitted.

Next, an inspecting method for detecting a defect such as a crack in the display device according to an exemplary embodiment will be described with reference to FIG. 6 to FIG. 9, as well as the above-described figures.

Figure 6:
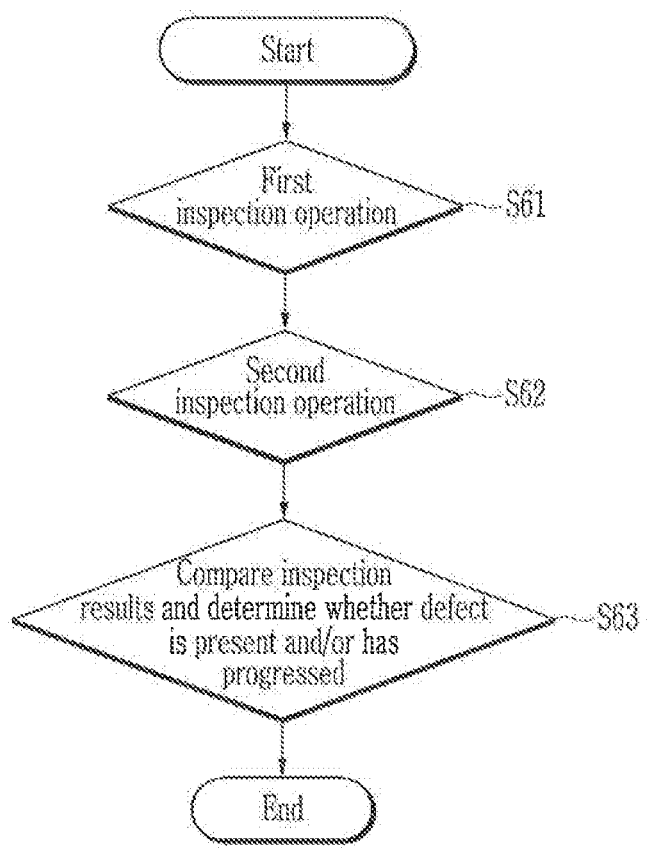
FIG. 6 is a flowchart showing a method of inspecting a display for a defect such as a crack in a display device, according to an exemplary embodiment of the present disclosure.

Referring to FIG. 6, an inspecting method according to an exemplary embodiment of the present disclosure includes performing a first inspection operation S61 and subsequently performing a second inspection operation S62 after performing the first inspection operation S61. The first inspection operation S61 may be referred to as a primary inspection operation, and the second inspection operation may be referred to as a secondary inspection operation. Similarly, a first inspection result may be referred to as a primary inspection result, and a second inspection result may be referred to as a secondary inspection result. After the first and second inspection operations S61 and S62 have been performed, the method compares the result (the information related to the resistance of the sensing wire) of the first inspection operation and the result (the information related to the sensing wire) of the second inspection operation with each other, and uses this comparison result to determine whether a defect is present in the display device at operation S63. The determination made in operation S63 may include determining the existence of the defect (e.g., a crack), as well as the progress and the progress degree of the defect (e.g., the crack) in the display panel 1000. This determined result may be included in the above-described output signal OUT3 to be output.

For convenience of explanation, hereinafter, a defect detected in the display panel 1000 may be referred to as a crack. However, exemplary embodiments of the present disclosure are not limited thereto, and exemplary embodiments may be utilized to determine defects other than a crack.

An additional inspection operation (e.g., a third inspection operation, a fourth inspection operation, etc.) executed after the second inspection operation may be further included in exemplary embodiments. According to exemplary embodiments, other than the time at which each of the inspection operations S61 and S62 (as well as any additional inspection operations) is performed, the inspection operations S61 and S62 (as well as any additional inspection operations) may be substantially the same.

The inspection result of each of the first inspection operation S61 and the second inspection operation S62 may include, for example, information including a resistance value indicating the wire resistance of each of the sensing wires M1, M2, M3, and M4, and/or information including a resistance comparison value indicating a comparison result between resistances of different wires from among the sensing wires M1, M2, M3, and M4. Such information may be referred to herein as resistance information, Resistance information obtained during a first inspection operation may be referred to as first resistance information, and resistance information obtained during a second inspection operation may be referred to as second resistance information, etc. For example, in an exemplary embodiment, the first inspection operation S61 and the second inspection operation S62 include information including a resistance value indicating the resistance of one of the sensing wires (e.g., sensing wire M1) at the time of the first inspection operation S61 and at the time of the second inspection operation S62. In an exemplary embodiment, the first inspection operation S61 and the second inspection operation S62 include information including a resistance comparison value indicating a comparison result between the resistance of two different wires (e.g., sensing wires M1 and M2) at the time of the first inspection operation S61 and at the time of the second inspection operation S62.

The operations performed within each inspection operation, such as the first inspection operation S61 and the second inspection operation S62, according to an exemplary embodiment of the present disclosure, will be described with reference to FIG. 7 as well as the above-described figures.

In an exemplary embodiment, the circuit unit 750 respectively inputs the input signals In _M1, In_M2, In_M3, and In_M4 to the plurality of sensing wires M1, M2, M3, and M4, and receives the output signals Out_M1 and Out_M2, Out_M3, and Out_M4. The resistance detection units 752 and 753 of the circuit unit 750 detect each wire resistance of the sensing wires M1, M2, M3, and M4 based on the output signals Out_M1, Out_M3, and Out_M4 (S71), and the determining unit 754 determines whether the detected resistance is within a first predetermined range. The first predetermined range may be, for example, a range of about −15% to about +15% with respect to a center value (e.g., about 500 kΩ, about 600 kΩ, about 700 kΩ, etc.) of the resistance, however, the first predetermined range is not limited thereto. The first predetermined range may be stored in the memory 756. If each wire resistance of the sensing wires M1, M2, M3, and M4 is within the first predetermined range, it may be determined that the wires are in the normal wire state within a process dispersion range, and thus, that the display panel 1000 may be in good condition. Otherwise, if each wire resistance of the sensing wires M1, M2, M3, and M4 is outside of the first predetermined range, it is determined that a defect (e.g., a crack) is present in the display panel 1000.

For example, each determining unit described herein may compare a resistance value to an upper threshold value and a lower threshold value to determine whether the resistance value is within a predetermined range. When the resistance value is between the upper threshold value and the lower threshold value, the resistance value is determined to be within the predetermined range.

If it is determined that the wire resistance of the sensing wires M1, M2, M3, and M4 is in the first predetermined range, each detected resistance of the sensing wires M1, M2, M3, and M4 is stored in the memory 756 (S72), and the comparators 751a, 751b, and 751c of the comparator unit 751 compare the resistances of the sensing wires M1, M2, M3, and M4 detected from the resistance detection units 752 and 753 with each other, thereby determining whether a resistance comparison value (e.g., a difference between resistances, or a ratio between the resistances) is within a second predetermined range (S73). If any one resistance of the sensing wires M1, M2, M3, and M4 is determined to be a reference resistance, the second predetermined range may be determined as a range (e.g., within about 15%) of the ratio for the reference resistance of the resistance comparison value. The second predetermined range may be stored in the memory 756. If the resistance comparison value is within the second predetermined range, it may be determined that the display panel 1000 is in good condition, otherwise, it is determined that a defect (e.g., a crack) is present in the display panel 1000. Detection sensitivity may be controlled through the control of the second predetermined range. The control of the second predetermined range may be executed through the controller 757.

The second predetermined range may have a plurality of ranges that are different from each other, thereby allowing for the determination of a crack progress degree (e.g., the severity/degree that the crack is progressing). For example, the second predetermined range may have a plurality of ranges divided into a plurality of levels such as 3%, 5%, 7%, 9%, 12%, 15%, 20%, 25%, 30%, and 40%. The detailed information for the progress degree of the crack may be obtained by determining whether the resistance comparison value (the difference or the ratio) is within any range from among the plurality of ranges. For example, a fine crack degree may be sensed by determining whether the resistance comparison value is within any range from among a relatively small range (e.g., less than 15%) the second predetermined range.

Since the sensing wires M1, M2, M3, and M4 are simultaneously formed in the same manufacturing process, they are affected by the same process dispersion, thereby having equal wire width deviation, and the sensing wires M1, M2, M3, and M4 may each be a reference wire for each other capable of comparing the change of the wire resistance.

For example, the crack generation may be sensed in the left peripheral area PA of the display area DA by using the resistance comparison value between the wire resistances of the sensing wire M1 and the sensing wire M2 positioned at the left side with respect to the display area DA, and the crack generation may be sensed in the right peripheral area PA of the display area DA by using the resistance comparison value between the wire resistances of the sensing wire M3 and the sensing wire M4 positioned at the right side with respect to the display area DA. Since cracks often begin from the outside of the substrate 110, a probability that the resistances of the sensing wires M2 and M4 positioned closer to the display area DA become higher than the resistance of the sensing wires M1 and M3 positioned closer to the edge of the display panel 1000 is low. Accordingly, the aspect or the degree of the crack generated in two wires may be different if the crack is generated in the peripheral area PA. Accordingly, when the defect such as the crack is generated in the display panel 1000, the crack generation may be sensed by using the difference between the wire resistances of the sensing wires M1 and M2 or M3 and M4 positioned at the same side with respect to the display area DA.

However, when the crack is generated at the wide area of the peripheral area PA positioned at one side with respect to the display area DA, it may be difficult to sense the wire resistance difference between two of the sensing wires M1 and M2 or M3 and M4 positioned at the peripheral area PA of the same side and adjacent to each other. In this case, in the present exemplary embodiment, the defect generation such as the crack in the peripheral area PA may be correctly determined through the comparison between the resistances of the sensing wires (one of M1 and M2 and one of M3 and M4) positioned at the peripheral area PA of the different sides from each other with respect to the display area DA.

If it is determined that the resistance comparison value between the sensing wires M1, M2, M3, and M4 is in the second predetermined range, the resistance comparison value is stored in the memory 756 (S74).

According to a comparative example, since the crack generation of the display panel is sensed by an analog method by applying a voltage to a sensing wire to sense the crack and inspecting a lighting state of the display panel, an error detection probability is high depending on the resistance change due to the wire width deviation (10 to 15%) in the sensing wire by the process dispersion, visual inspection is difficult, and the crack degree may not be recognized. However, according to an exemplary embodiment of the present disclosure, since the crack generation of the display panel 1000 is inspected by a digital method through the circuit unit 750, the inspection of the defect generation such as the crack is improved. Further, since the plurality of sensing wires M1, M2, M3, and M4 under the same process dispersion are used as a reference for each other, the error detection according to the process dispersion may be prevented, thereby increasing defect inspection accuracy.

In addition, since it is determined that the resistance comparison value is in any of the second predetermined ranges, the detailed information for the progress degree of the crack may be obtained, and a fine crack may also be sensed/detected.

Further, since the comparator unit 751 is controlled, the sensitivity of the detection of the defect generation such as the crack may be controlled. Further, the first predetermined range and the second predetermined range may be controlled. The control of the comparator unit 751, the first predetermined range, and the second predetermined range, may be obtained through the controller 757.

Figure 7:
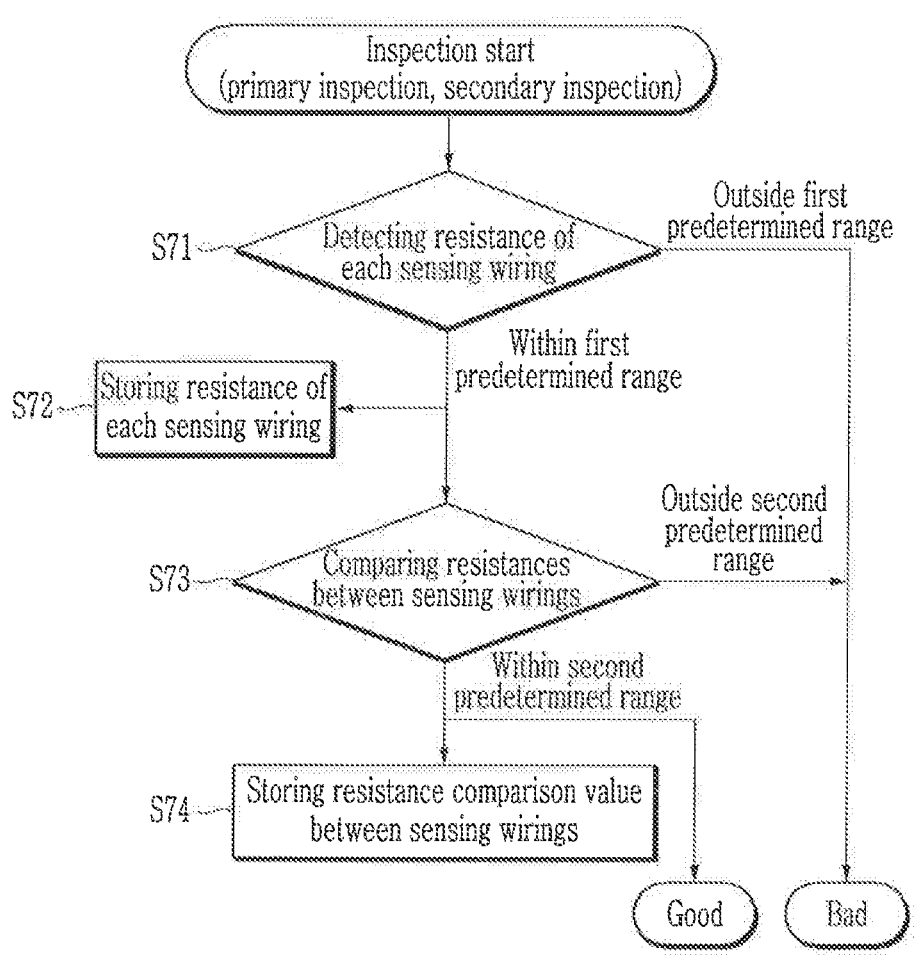
FIG. 7 is a flowchart showing operations of a defect inspection method performed to detect a defect such as a crack in a display device, according to an exemplary embodiment of the present disclosure.

Referring to FIG. 6 and FIG. 7, in operation S63, the information including the resistance values of the sensing wires M1, M2, M3, and M4 stored in the memory 756 in each of the first inspection operation 861 and the second inspection 861, and/or the information including the resistance comparison values between the sensing wires M1, M2, M3, and M4, may be compared with each other to determine the progress of the crack and the progress degree. This is further described with reference to FIG. 8 and FIG. 9.

FIG. 8 and FIG. 9 are tables showing an example of storing a result of a first inspection operation and a second inspection operation in the memory 756 in a method of inspecting a display device to identify a defect such as a crack in the display device, according to an exemplary embodiment of the present disclosure.

Referring to FIG. 8, in an example, the resistance of one of the sensing wires M1, M2, M3, or M4 is detected as 170 kΩ as the first inspection result such that a number 4 (or 170 kΩ) is stored in the memory 756, and the resistance of the corresponding sensing wire M1, M2, M3, or M4 is detected as 185 kΩ as a second inspection result such that a number 7 (or 185 kΩ) is stored in the memory 756. The resistance of a range that is not shown in the table of FIG. 8 may be stored as a number immediately before or after the corresponding resistance depending on a setting. For example, the detected resistance in the case of 173 kΩ may be stored as the number 4 or 5.

As the comparator 751d of the comparator unit 751 compares the resistances detected in the first inspection operation S61 and the second inspection S62, when a resistance difference is not generated, it may be determined that the progress of the crack is not generated (e.g., a crack is not getting worse), when the difference of the resistance is larger than 0 and is larger than a third predetermined range, it may be determined that the progress degree of the crack is large, and when the difference of the resistance is larger than 0 and is smaller than the third predetermined range, it may be determined that the progress degree of the crack is small. The third predetermined range may be stored in the memory 756. For example, in FIG. 8, since the resistance of the second inspection result is larger than the resistance of the first inspection result, it may be determined that progress is occurring in the crack of the display panel 1000 (e.g., the crack is getting worse), and if the third predetermined range is set as No. 3, it may be determined that the progress degree of the crack is relatively large.

Referring to FIG. 9, the resistance comparison value of two sensing wires from among M1, M2, M3, and M4 is detected as 6% as the first inspection result such that the number 4 (or 6%) is stored in the memory 756, and the resistance comparison value is detected as 9% as the second inspection result such that the number 7 (or 9%) is stored in the memory 756. As the comparator 751d of the comparator unit 751 compares the resistance comparison valued detected in the first inspection operation S61 and the second inspection operation S62, when a difference is not generated, it may be determined that the progress of the crack is not generated (e.g., the crack is not getting worse), when the difference is larger than 0 and is larger than a fourth predetermined range, the progress degree of the crack may be determined to be large, and when the difference of the crack is larger than 0 and is smaller than the fourth predetermined range, the progress degree of the crack may be determined to be small. The fourth predetermined range may be stored in the memory 756. For example, in FIG. 9, since the resistance comparison value of the second inspection result is larger than the resistance comparison value of the first inspection result, it may be determined that the progress occurs in the crack of the display panel 1000, and if the fourth predetermined range is set as the number No. 3, the progress degree of the crack may be determined to be relatively large.

As described above, according to exemplary embodiments of the present disclosure, through the comparison of information including resistance information obtained at a plurality of inspection operations performed at different times, correct and detailed information relating to the progress generation and the progress degree of a defect such as a crack may be obtained.

In contrast to the exemplary embodiment described with reference to FIG. 7, in an exemplary embodiment, the step of determining whether the resistance of the sensing wires M1, M2, M3, and M4 is within the first predetermined range (S71) and the step of storing the resistance of each of the sensing wires M1, M2, M3, and M4 (S72) may be omitted, and only the step of comparing the detected resistances (S73) and the step of storing the resistance comparison value between the sensing wires M1, M2, M3, and M4 (S74) may be performed. Alternatively, in an exemplary embodiment, only the operation S71 and the operation S72 may be performed, and the operation S73 and the operation S74 may be omitted.

According to an exemplary embodiment, the circuit unit 750 may further include a comparator that compares the resistance results of two sensing wires positioned at a same side with respect to the display area DA or positioned at opposing different sides with respect to the display area DA. In this case, the circuit unit 750 may determine whether the crack is generated at any side with respect to the display area DA, and if additional cracks are generated at any side. For example, when the resistance difference between the two wires M1 and M2 or M3 and M4 positioned at one side (referred to as a first side) with respect to the display area DA is larger than the resistance difference between two wires (one of M1 and M2 and one of M3 and M4) positioned at the other side with respect to the display area DA, it may be determined that the crack is generated, or additional cracks are generated, in the peripheral area PA of the first side, while in the opposite case, it may be determined that the crack is generated, or additional cracks are generated, in the peripheral area PA of the side opposite to the first side.

According to an exemplary embodiment, when just one sensing wire is positioned at the peripheral area PA positioned at one side with respect to the display area DA, the resistances of two sensing wires positioned at opposite sides to each other with respect to the display area DA may be compared through the comparator 751*c* to determine the defect generation such as the crack in the peripheral area PA.

According to an exemplary embodiment, two sensing wires (M1 and M2 or M3 and M4) positioned at the peripheral area PA of the same side with respect to the display area DA may extend in different directions from each other. In this case, the probability that the crack does not simultaneously occur in two sensing wires (M1 and M2 or M3 and M4) may be high. Accordingly, it may be determined whether the defect such as the crack occurs in the display panel 1000 through the resistance comparison of two sensing wires (M1 and M2 or M3 and M4).

The wire resistance comparison between the sensing wires M1, M2, M3, and M4 to sense/detect the defect such as the crack of the display panel 1000 and/or the comparison of the results of the plurality of inspection operations may be performed using various other methods.

Next, the display device according to an exemplary embodiment will be described with reference to FIG. 10 as well as the above-described figures. Hereinafter, the same constituent elements as any of the previous exemplary embodiments may be indicated by the same reference numerals, and a repetitive description thereof may be omitted.

Figure 10:
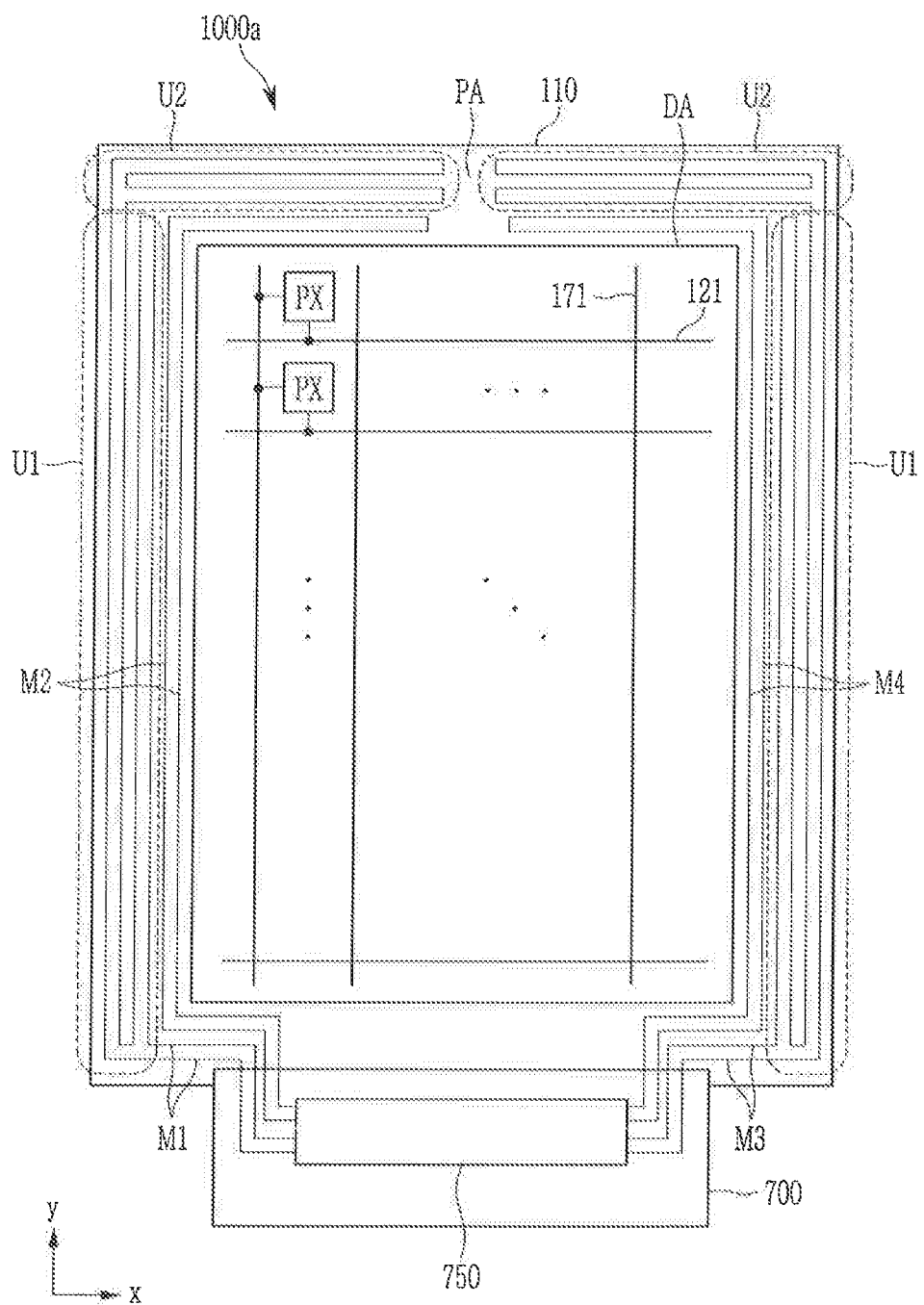
FIG. 10 and FIG. 11 are layout views of a display device according to an exemplary embodiment of the present disclosure.

Referring to FIG. 10, the display device according to the present exemplary embodiment is substantially the same as the previously described exemplary embodiment (including the display panel 1000*a* that is substantially the same as the display panel 1000 of the previous exemplary embodiment), however, at least one sensing wire from among the sensing wires M1, M2, M3, and M4 has a plurality of reciprocating structures U1 and U2. For example, FIG. 10 shows an exemplary embodiment in which the sensing wires M1 and M3 as a part of the plurality of sensing wires M1, M2, M3, and M4 have the plurality of reciprocating structures U1 and U2. At least one of the sensing wires M1, M2, M3, and M4 having the plurality of reciprocating structures U1 and U2 reciprocates in plural in the y direction in the peripheral area PA of the right or the left with respect to the display area DA to form the reciprocating structure U1, then reciprocates in plural in the x direction in the peripheral area PA of the upper side of the display area DA to form the reciprocating structure U2, and then is returned to be connected to the circuit unit 750.

Alternatively, the sensing wires M2 and M4 may also have a plurality of reciprocating structures like the sensing wires M1 and M3.

According to the exemplary embodiment shown in FIG. 10, the entire wire length of the sensing wires M2 and M4 may be shorter than the entire wire length of the sensing wires M1 and M3 having the plurality of reciprocating structures U1 and U2. As a result, the area of the region occupied by the sensing wires M2 and M4 may be smaller than the area of the region occupied by the sensing wires M1 and M3. For example, according to an exemplary embodiment, the number of reciprocations of the reciprocating structure of the part of the sensing wires M2 and M4 may be reduced and/or the wire length may be reduced to reduce the region occupied with the sensing wires M1, M2, M3, and M4 to reduce a bezel region of the display device.

In this case, in the method of inspecting the defect such as the crack, the circuit unit 750 may additionally perform a step of compensating the difference of the wire resistance of the sensing wires M2 and M4 for the sensing wires M1 and M3. For example, to compensate the difference of the resistance of the sensing wires M2 and M4 for the sensing wires M1 and M3, the resistance difference according to the wire length difference between the sensing wires M1 and M3 and the sensing wires M2 and M4 may be compensated by applying (e.g., multiplying) a weight value by the detected resistance of the sensing wires M2 and M4. For example, the circuit unit 750 may compensate the wire resistance deviation by a method of determining whether the wire resistance value of the sensing wires M2 and M4 is within any region from among regions divided into 20%, 40%, 60%, 80%, and 100% of the wire resistance of the sensing wires M1 and M3 to apply the weight value corresponding thereto.

In addition, when the wire resistance difference is generated between the sensing wires M1, M2, M3, and M4 due to several factors such as, for example, a length difference depending on a position without the crack, the circuit unit 750 may apply the weight value to the detected resistance of the sensing wire by the method described above to compensate the difference of the wire resistance.

Next, the display device according to an exemplary embodiment will be described with reference to FIG. 11 and FIG. 12 as well as the above-described figures.

Figure 11:
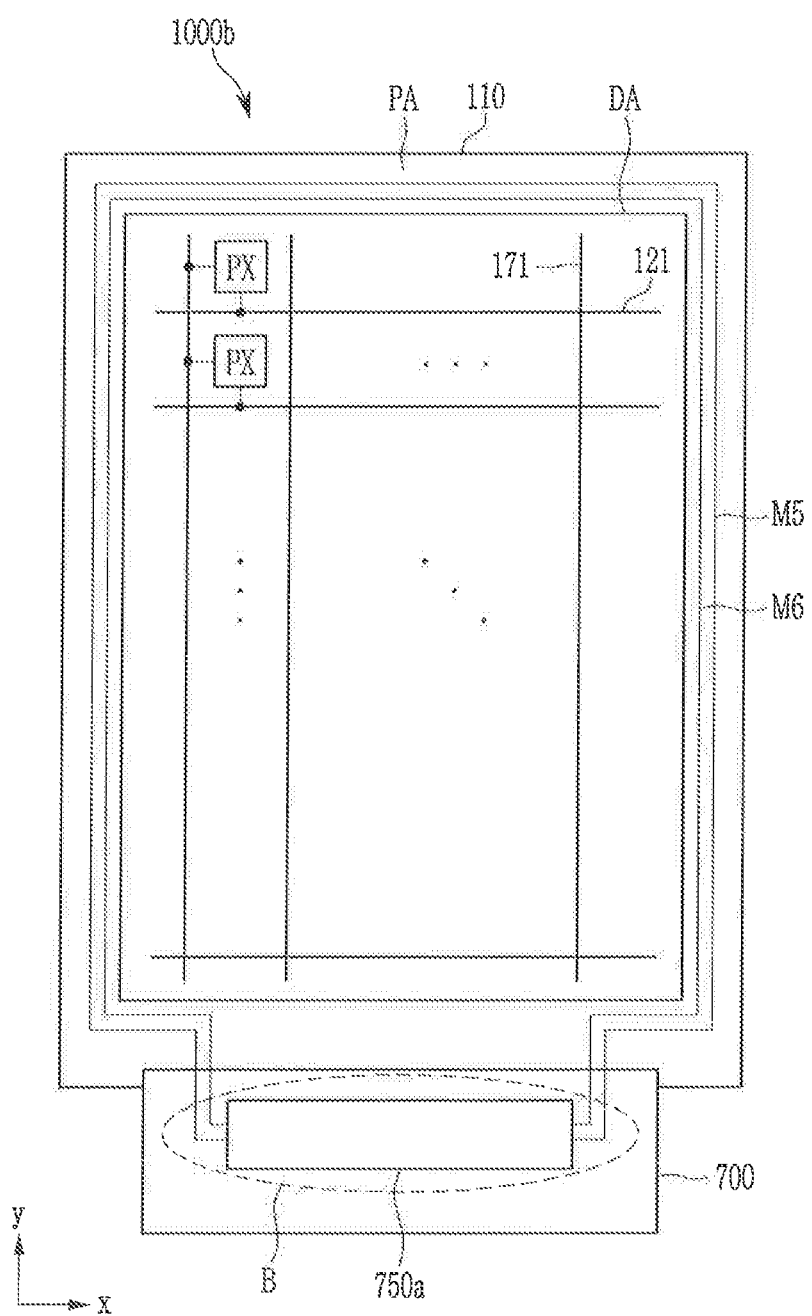
Figure 12:
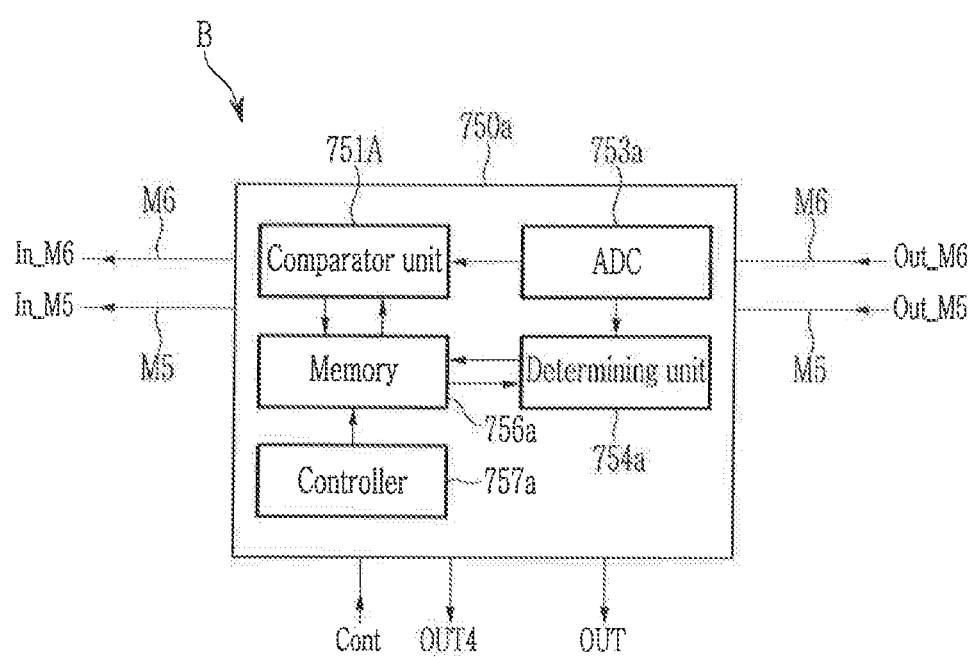
FIG. 12 is an enlarged view of portion B of the display device shown in FIG. 11, according to an exemplary embodiment of the present disclosure.

Referring to FIG. 11 and FIG. 12, the display device according to the present exemplary embodiment is substantially the same as the previously described exemplary embodiments (including the display panel 1000b that is substantially the same as the display panels 1000 and 1000a of the previous exemplary embodiments), however, only a pair of sensing wires M5 and M6 are positioned in the entire peripheral area PA, thereby reducing the region occupied with the sensing wire in the peripheral area PA and reducing the number of pad portions of a circuit unit 750a.

One end of the sensing wire M5 may be connected to one side of the circuit unit 750a and the other end thereof may be connected to the other side of the circuit unit 750a (e.g., the opposite side). The sensing wire M5 starts from one end and extends along the edge of at least three surfaces including the left side, the upper side, and the right side of the display area DA to be extended to the other end. The sensing wire M5 extending along the periphery of the display area DA may have at least one reciprocating structure (or a meandering shape) that is partially reciprocated in plural. The plurality of reciprocating structures may be connected to each other, thereby forming one wire.

One end of the sensing wire M6 may be connected to one side of the circuit unit 750a and the other end thereof may be connected to the other side of the circuit unit 750a. The structure of the sensing wire M6 may be similar to that of the sensing wire M5.

The wire resistances of two sensing wires M5 and M6 may be different from each other or may be similar to each other. For example, the wire resistance of the sensing wire M6 may be smaller than the wire resistance of the sensing wire M5, and in this case, the number of reciprocations of the reciprocating structure included in the sensing wire M6 may be smaller than the number of reciprocations of the reciprocating structure included in the sensing wire M5.

The sensing wire M6 may be positioned between the sensing wire M5 and the display area DA, however, the position of the sensing wire M6 is not limited thereto. For example, the positions of the sensing wire M5 and the sensing wire M6 shown in FIG. 11 may be exchanged with each other.

Referring to FIG. 12, which is an enlarged view of portion B shown in FIG. 11, the circuit unit 750a is substantially the same as the above-described circuit unit 750, however, the circuit unit 750a may input the input signals In_M5 and In_M6 as the crack defect test signal to one end of each of the sensing wires M5 and M6, and may receive the output signals Out_M5 and Out_M6 from the other end of the sensing wires M5 and M6.

The circuit unit 750a may include a comparator unit 751A, a resistance detection unit 753a, a determining unit 754a, a memory 756a, and a controller 757a. These components are substantially the same as the comparator unit 751, the resistance detection unit 753, the determining unit 754, the memory 756, and the controller 757 described above, respectively. For convenience of explanation, only differences regarding these components are described herein.

The resistance detection unit 753a detects the wire resistance of the sensing wires M5 and M6 based on the output signals Out_M5 and Out_M6 of the sensing wires M5 and M6. The resistance detection unit 753a outputs the detected resistance of each of the sensing wires M5 and M6 to the comparator unit 751A and the determining unit 754a. The resistance detection unit 753a stores the detected resistance of the sensing wires M5 and M6 in the memory 756a.

The determining unit 754a determines whether each resistance of the sensing wires M5 and M6 input from the resistance detection unit 753a is in the first predetermined range to output the determined result. The determined result may be included in the output signal OUT, and may be output outside the circuit unit 750a. The resistance of the sensing wires M5 and M6 may be stored in the memory 756a according to the determined result of the determining unit 754a.

The comparator unit 751A is substantially the same as the above-described comparator unit 751, however, the comparator that compares the resistance of the sensing wire M5 and the resistance of the sensing wire M6 to output the determined result, and the comparator that compares the results of the plurality of inspection operations to output the determined result, may be included. The comparator unit 751A may receive the result of each inspection operation from the memory 756a. The comparison result of the comparator unit 751A may be included in the output signal OUT4 to be output outside the circuit unit 750a and to be stored in the memory 756a.

The controller 757a may receive the input control signal Cont from the outside to control each part of the circuit unit 750a, including, for example, the setting of the memory 756a.

The other characteristics of the circuit unit 750a are substantially the same as those of the circuit unit 750 of the previous exemplary embodiment. For convenience of explanation, a repetitive description thereof is omitted. Further, the inspecting method of the plurality of inspection operations is substantially the same as the above-described inspecting method, and a repetitive description thereof is omitted.

Next, the display device and the inspecting method according to an exemplary embodiment will be described with reference to FIG. 13 to FIG. 15 as well as the above-described figures.

Figure 13:
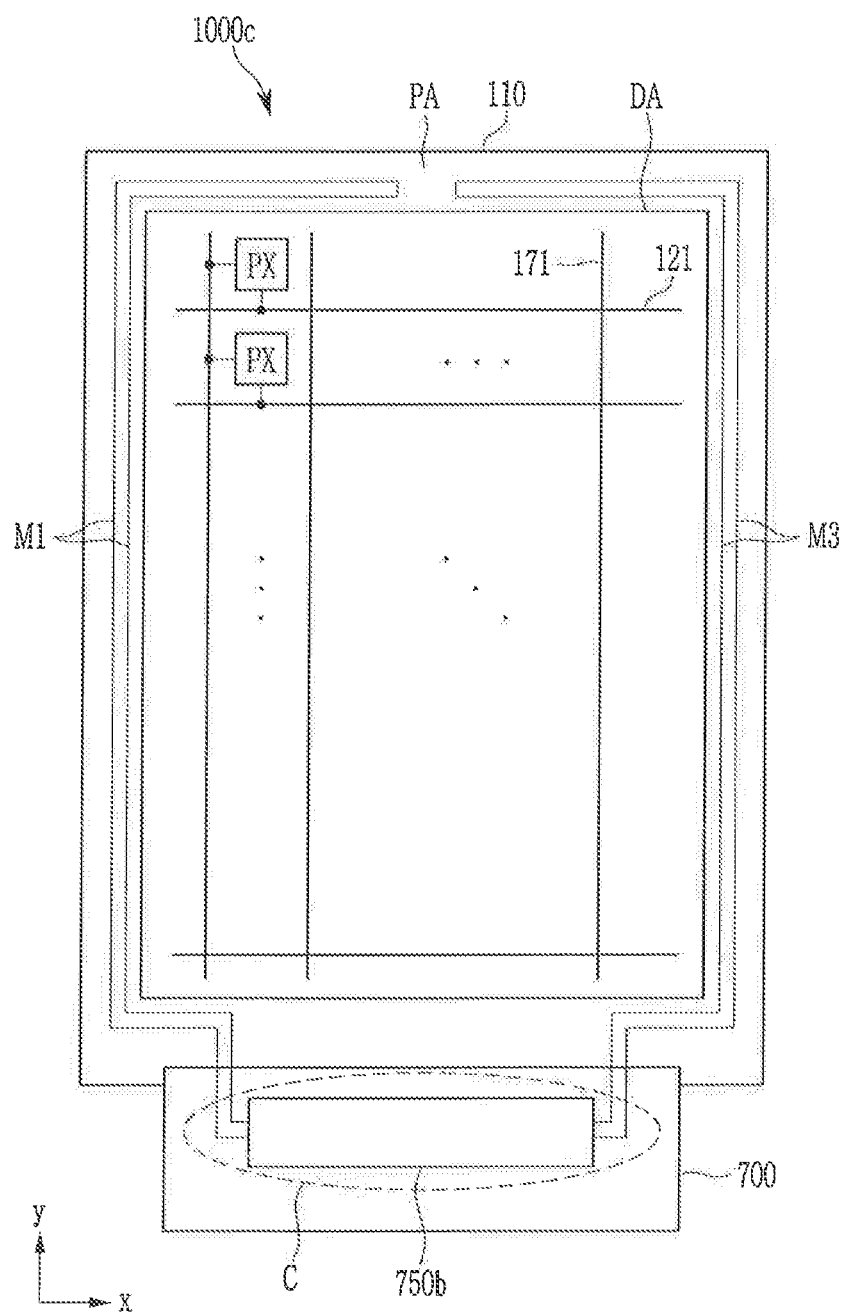
FIG. 13 is a layout view of a display device, according to an exemplary embodiment of the present disclosure.
Figure 14:
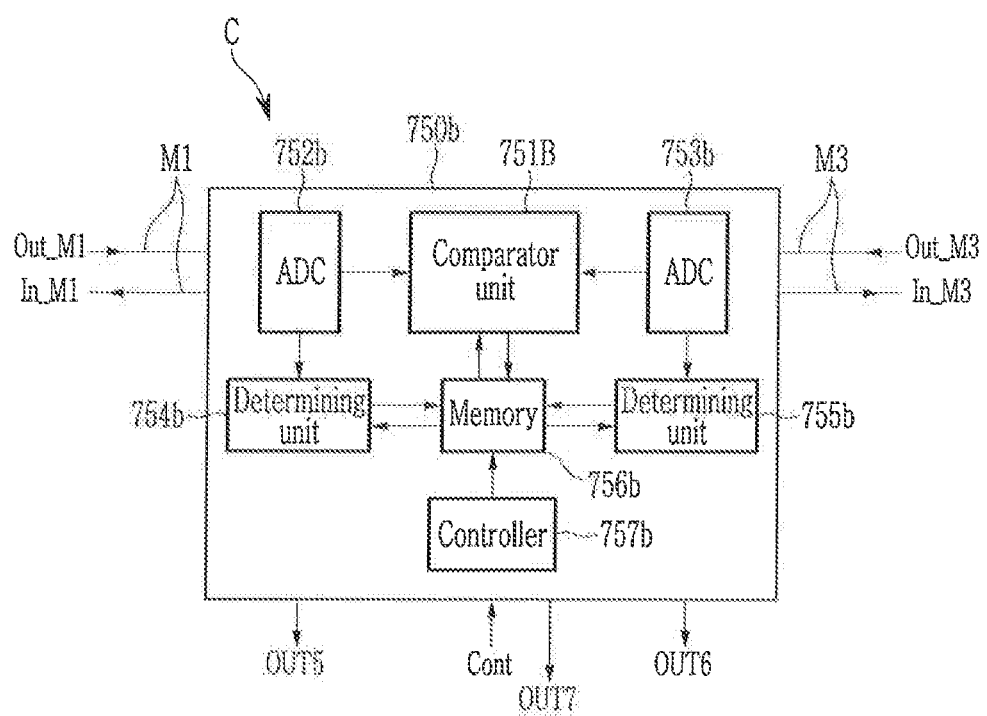
FIG. 14 is an enlarged view of portion C of the display device shown in FIG. 13, according to an exemplary embodiment of the present disclosure.
Figure 15:
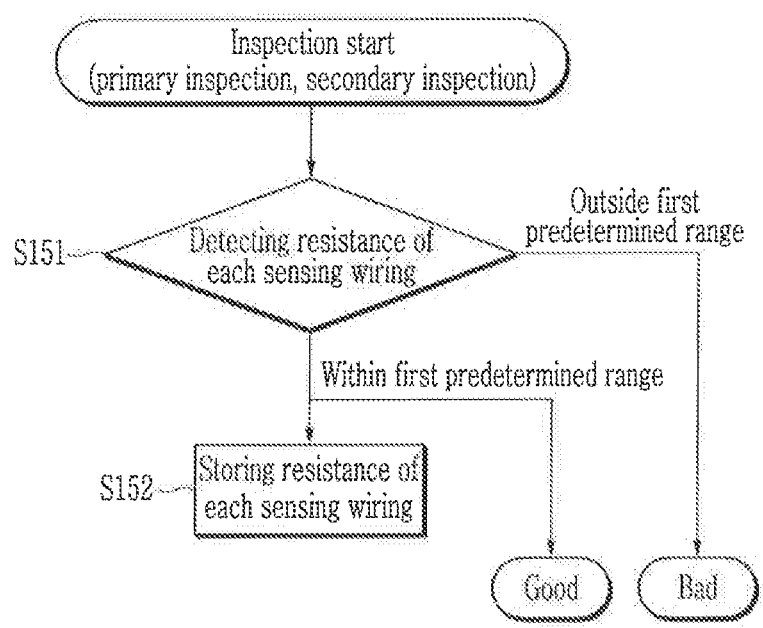
FIG. 15 is a flowchart showing a method of inspecting a display device for a defect such as a crack, according to an exemplary embodiment of the present disclosure.

Referring to FIG. 13 and FIG. 14, the display device according to the present exemplary embodiment is substantially the same as the previously described exemplary embodiments (including the display panel 1000c that is substantially the same as the display panels 1000 and 1000a of the previous exemplary embodiments), however, the above-described sensing wires M2 and M4 are omitted, and only one of the sensing wires M1 and M3 is positioned in the peripheral area PA of one side with respect to the display area DA.

A circuit unit 750b may include resistance detection units 752b and 753b, a comparator unit 751B, determining units 754b and 755b, a memory 756b, and a controller 757b. These components are substantially the same as the resistance detection units 752 and 753, the comparator unit 751, the determining units 754 and 755, the memory 756, and the controller 757 as described above, respectively. For convenience of explanation, only differences relating to these components are described herein.

The resistance detection unit 752b detects the wire resistance of the sensing wire M1 based on the output signal Out_M1 from the sensing wire M1, and the resistance detection unit 753*b* detects the wire resistance of the sensing wire M3 based on the output signal Out_M3 from the sensing wire M3. The resistance detection units 752*b* and 753*b* output the detected resistance of each of the sensing wires M1 and M3 to the comparator unit 751B and the determining units 754*b* and 755*b*. The resistance detection units 752*b* and 753*b* store the detected resistance of the sensing wires M1 and M3 in the memory 756*b*.

The comparator unit 751B is substantially the same as the above-described comparator unit 751, however, the comparator that compares the resistances of the sensing wires M1 and M3 to output the determined result and the comparator that compares the results of the plurality of inspection operations to output the determined result is included. The comparator unit 751B receives the result of each inspection operation from the memory 756*b*. The comparison result of the comparator unit 751B may be included in the output signal OUT7 to be output outside the circuit unit 750*b* and to be stored in the memory 756*b*.

The determining unit 754*b* determines whether the resistance of the sensing wire M1 input from the resistance detection unit 752*b* is included in the first predetermined range to output the determined result, and the determining unit 755*b* determines whether the resistance of the sensing wire M3 input from the resistance detection unit 753*b* is included in the first predetermined range to output the determined result. The determined result of the determining units 754*b* and 755*b* may be included in the output signals OUT5 and OUT6 to be output outside the circuit unit 750*b*, and the resistance of the sensing wires M1 and M3 may be stored in the memory 756*b* according to the determined result of the determining units 754*b* and 755*b*.

The controller 757*b* may receive the input control signal Cont from the outside to control each part of the circuit unit 750*b*, including, for example, the setting of the memory 756*b*.

The resistance of the sensing wires M1 and M3 detected through the resistance detection units 752*b* and 753*b* may be stored in the memory 756*b* of the circuit unit 750*b* and may be output outside.

Each inspection operation included in a method of inspecting a display device for a defect such as a crack according to an exemplary embodiment of the present disclosure will now be described with reference to FIG. 15 along with FIG. 13 and FIG. 14.

First, the circuit unit 750*b* respectively inputs the input signals In_M1 and In_M3 to the sensing wires M1 and M3, and receives the output signals Out_M1 and Out_M3. The resistance detection units 752*b* and 753*b* respectively detect the resistance of the sensing wires M1 and M3 based on the output signals Out_M1 and Out_M3, and the determining units 754*b* and 755*b* determine whether the detected resistance is within the first predetermined range (S151). The first predetermined range may be determined with the range within about ±3%, 6%, 9%, 12%, 15%, 20%, or 30% for the center value (e.g., about 500 kΩ, 600 kΩ, 700 kΩ, etc.) of the resistance, however, exemplary embodiments are not limited thereto. If the resistance of the sensing wires M1 and M3 is within the first predetermined range, it is determined that the sensing wires M1 and M3 are in the normal wire state within the process dispersion range, and the display panel may be determined to be good, otherwise, the display panel is determined to be bad.

If it is determined that the wire resistance of the sensing wires M1 and M3 is within the first predetermined range, each detected resistance of the sensing wires M1 and M3 is stored in the memory 756*b* (S152).

The comparator unit 751B may further perform a step of comparing the resistances of the sensing wires M1 and M3 detected in the resistance detection units 752*b* and 753*b* with each other, and determining whether the resistance comparison values (the difference or the ratio between the resistances) are within the second predetermined range (as described above with reference to FIG. 7). If the resistance comparison value is within the second predetermined range, the display panel may be determined to be good, otherwise the display panel may be determined to be bad.

Additional characteristics of the circuit unit 750*b* may be substantially the same as those of the circuit unit 750 of the previous exemplary embodiment, and the inspecting method may also be substantially the same as the above-described inspecting method.

Next, the display device according to an exemplary embodiment will be described with reference to FIG. 16 and FIG. 17 as well as the above-described figures.

Figure 16:
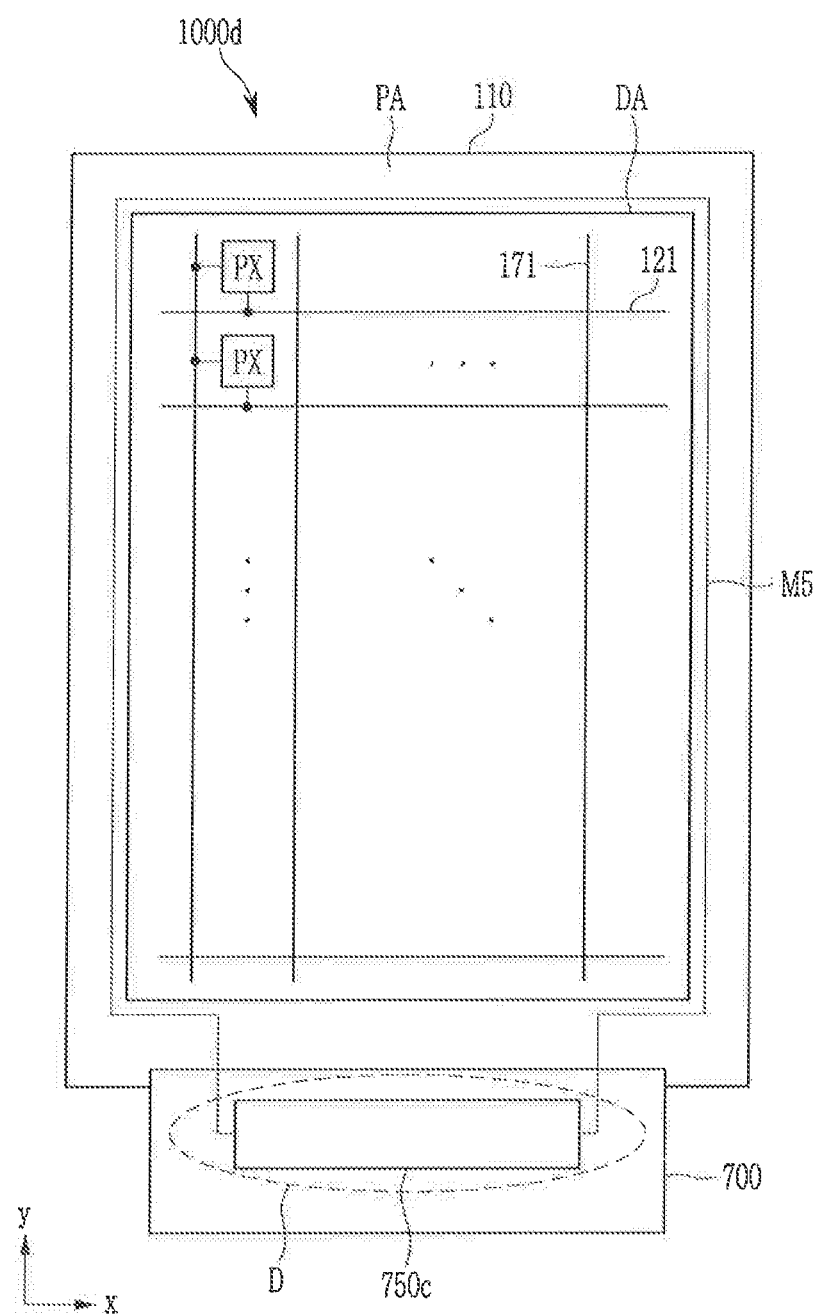
FIG. 16 is a layout view of a display device, according to an exemplary embodiment of the present disclosure.
Figure 17:
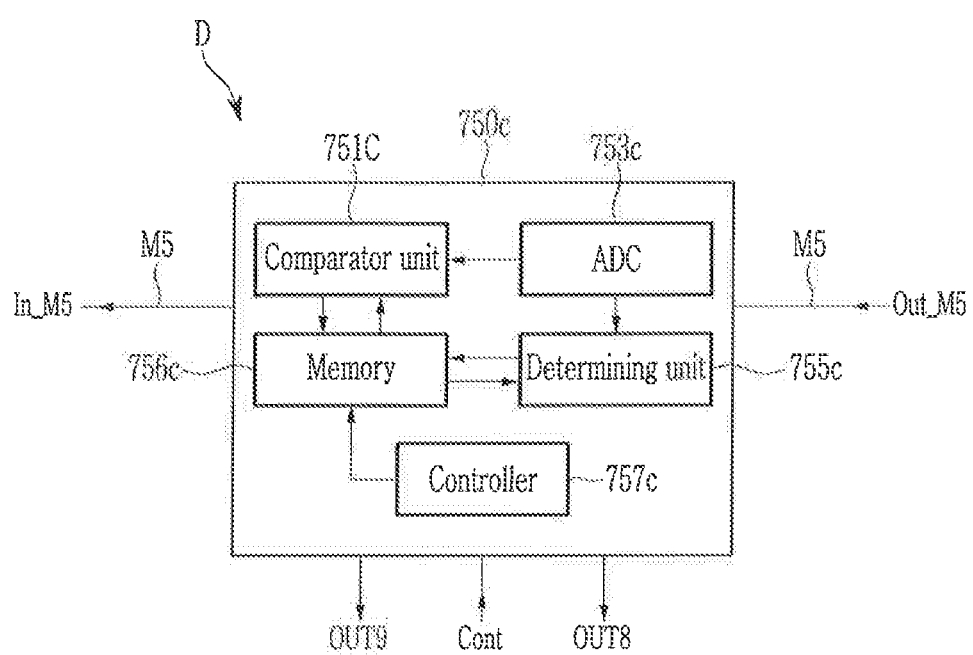
FIG. 17 is an enlarged view of portion D of the display device shown in FIG. 16, according to an exemplary embodiment of the present disclosure.

Referring to FIG. 16 and FIG. 17, the display device according to the present exemplary embodiment is substantially the same as the previously described exemplary embodiment shown in FIG. 11 and FIG. 12 (including the display panel 1000*d* that is substantially the same as the display panel 1000*b* of the previous exemplary embodiment), however, the sensing wire M6 is omitted, and only the sensing wire M5 extending along the entire peripheral area PA is included.

A circuit unit 750*c* inputs the input signal In_M5 as the crack defect test signal to one end of the sensing wire M5, and receives the output signal Out_M5 from the other end of the sensing wire M5.

The circuit unit 750*c* includes a comparator unit 751C, a resistance detection unit 753*c*, a determining unit 755*c*, a memory 756*c*, and a controller 757*c*. These components are substantially the same as the comparator unit 751, the resistance detection unit 753, the determining unit 754, the memory 756, and the controller 757 described above, respectively, and only differences thereof be described herein.

The resistance detection unit 753*c* detects the wire resistance of the sensing wire M5 based on the output signal Out_M5 of the sensing wire M5, and outputs the detected resistance to the comparator unit 751C and the determining unit 755*c*. The resistance detection unit 753*c* also transmits the detected resistance of the sensing wire M5 to the memory 756*c* to be stored.

The determining unit 755*c* determines whether the resistance of the sensing wire M5 input from the resistance detection unit 753*c* is within the first predetermined range to output the determined result, and the determined result may be included in the output signal OUT8 to be output outside the circuit unit 750*c*. The resistance of the sensing wire M5 may be stored in the memory 756*c* according to the determined result of the determining unit 755*c*.

The comparator unit 751C is substantially the same as the above-described comparator unit 751, however, the comparator unit 751C may further include a comparator that compares the results of the plurality of inspection steps for the resistance of the sensing wire M5 with each other to output the determined result. The comparator unit 751C may receive the result of each inspection operation from the memory 756*c*. The comparison result of the comparator unit 751C may be included in the output signal OUT9 to be output outside the circuit unit 750*c*, and may also be stored in the memory 756*c*.

The controller 757c receives the input control signal Cont from the outside to control each part of the circuit unit 750c, including, for example, the setting of the memory 756c.

The resistance of the sensing wire M5 detected through the resistance detection unit 752c may be stored in the memory 756c and then may be output outside.

Additional characteristics of the circuit unit 750c may be substantially the same as those of the circuit unit 750 of the previous exemplary embodiment, and the inspecting method may also be substantially the same as the above-described inspecting method. For convenience of explanation, a repetitive description thereof is omitted.

Next, the display device according to an exemplary embodiment will be described with reference to FIG. 18 to FIG. 23 as well as the above-described figures.

Figure 18:
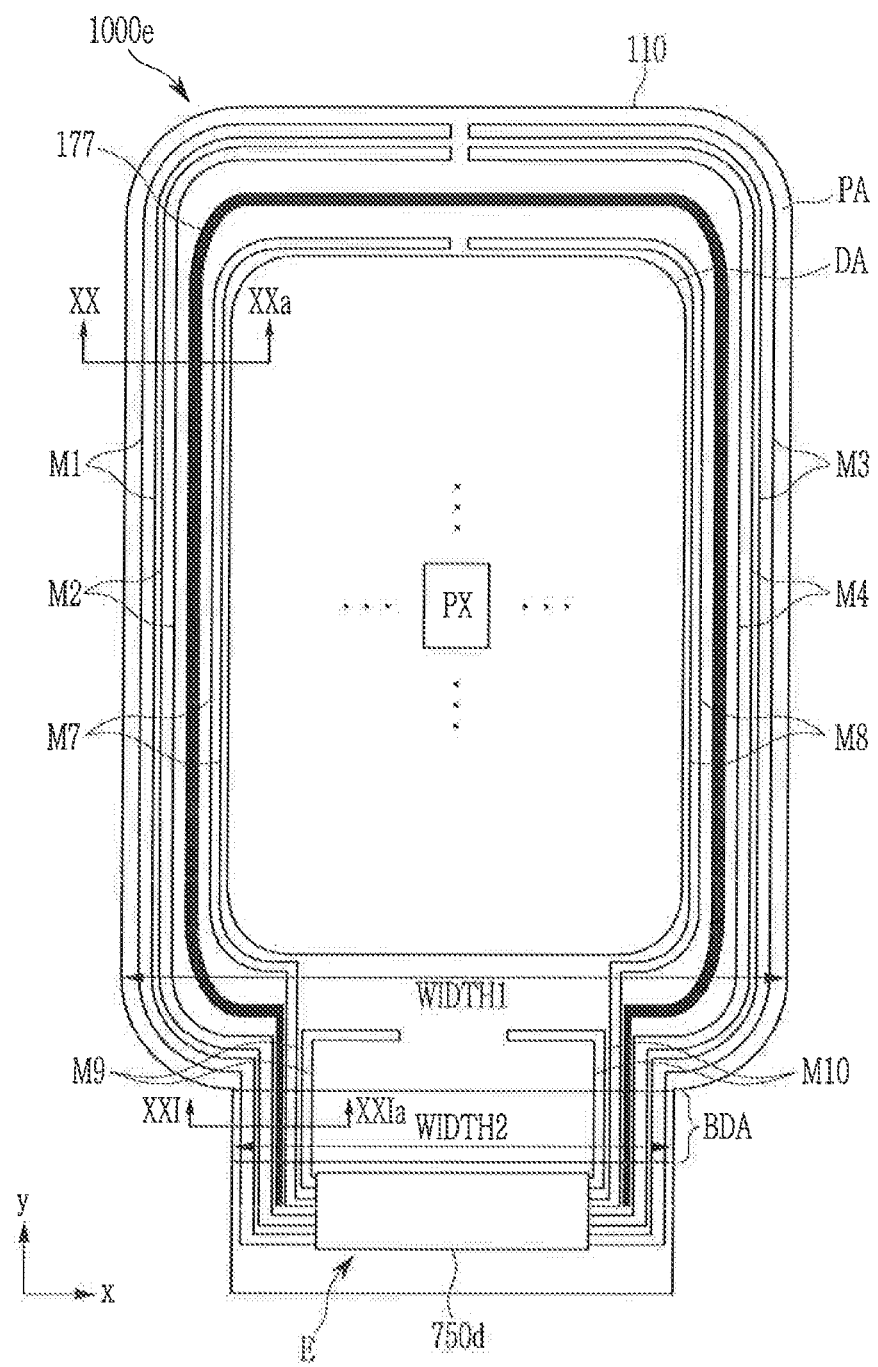
FIG. 18 is a layout view of a display device, according to an exemplary embodiment of the present disclosure.
Figure 19:
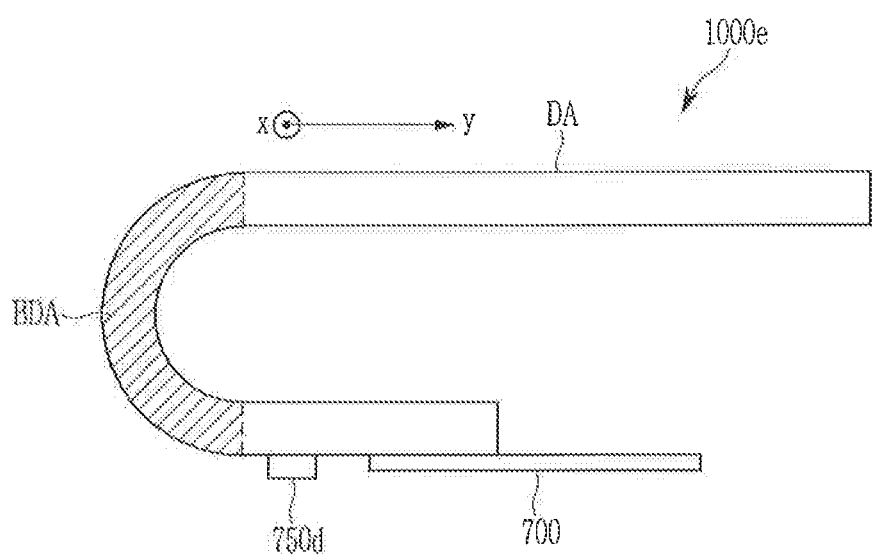
FIG. 19 is a view showing a state in which the display device shown in FIG. 18 is bent in a bending region, according to an exemplary embodiment of the present disclosure.

Referring to FIG. 18 and FIG. 19, the display device according to the present exemplary embodiment is substantially the same as the previously described exemplary embodiment shown in FIG. 1 to FIG. 5 (including the display panel 1000e that is substantially the same as the display panel 1000 of the previous exemplary embodiment). For convenience of explanation, the differences thereof will be described herein.

The peripheral area PA includes a bending region BDA in which the display panel 1000e is bent or is bendable. The bending region BDA may extend across the display panel 1000e substantially in the x direction. FIG. 18 shows a planar layout structure of the state in which the display panel 1000e is unfolded in the bending region BDA without being bent, and FIG. 19 schematically shows the state in which the display panel 1000e is bent in the bending region BDA. Referring to FIG. 19, the display panel 1000e is bent in the bending region BDA such that the peripheral area PA positioned outside the bending region BDA is warped behind the display panel 1000e, thereby not being visible from the front. A plurality of wires may pass through the bending region BDA, and the plurality of wires may extend in the y direction in the bending region BDA.

In the state in which the display panel 1000e is unfolded in the bending region BDA, a width WIDTH2 in the x direction of the display panel 1000e and the bending region BDA below the bending region BDA with respect to the bending region BDA may be smaller than a width WIDTH1 in the x direction of the display panel 1000e above the bending region BDA. However, the widths are not limited thereto. For example, in an exemplary embodiment, the two widths WIDTH1 and WIDTH2 may be about equal to each other.

As a circuit unit 750d is positioned in the peripheral area PA below the bending region BDA, if the bending region BDA of the display panel 1000e is bent, the circuit unit 750d may be positioned behind the display panel 1000e above the bending region BDA. The printed circuit film 700 may be bonded to the peripheral area PA outside of the circuit unit 750d. The circuit unit 750d may be positioned between the bonding region of the printed circuit film 700 and the display panel 1000e and the bending region BDA.

Referring to FIG. 18, the voltage transmitting line 177 that transmits the common voltage ELVSS is positioned in the peripheral area PA, and may extend along the periphery of the display area DA. Both ends of the voltage transmitting line 177 may be positioned in the peripheral area PA below the bending region BDA. The voltage transmitting line 177 starts from one end, extends along at least three sides of the left side, the upper side, and the right side of the display area DA after passing through the bending region BDA, and again passes through the bending region BDA to be extended into the peripheral area PA below the bending region BDA. The voltage transmitting line 177 may be positioned in the third conductive layer in which the data line is positioned, as described above.

Sensing wires M7 and M8 used to detect a defect, such as a crack or lifting, generated in the periphery of the display panel 1000e, may be positioned between the voltage transmitting line 177 and the display area DA. The sensing wire M7 may be positioned at the left side with respect to the display area DA, and the sensing wire M8 may be positioned at the right side.

Both ends of the sensing wires M7 and M8 may be respectively connected to the circuit unit 750d. For example, both ends of the sensing wires M7 and M8 may be respectively connected to the same side of the circuit unit 750d. Each of the sensing wires M7 and M8 starts from one end, extends along the left or right edge of the display area DA after passing through the bending region BDA, is bent and is again returned, and is connected to the circuit unit 750d through the bending region BDA, thereby having a reciprocating structure. The number of reciprocations of one reciprocating structure may be one as shown, or may be plural.

Each of the sensing wires M7 and M8 may further include a part that is connected to the part extending along the left or right edge of the display area DA, and extends along the upper edge of the display area DA.

Alternatively, in an exemplary embodiment, one of two sensing wires M7 and M8 may be omitted. In this case, one of the sensing wires M7 and M8 starts from one side of the circuit unit 750d, extends along the edge of the left side, the upper side, and the right side of the display area DA via the bending region BDA, and again passes the bending region BDA to be connected to the other side of the circuit unit 750d.

The display device according to the present exemplary embodiment may also include the sensing wires M1, M2, M3, and M4, similar to the previous exemplary embodiment shown in FIG. 1 to FIG. 5. Each of the sensing wires M1, M2, M3, and M4 starts from one end connected to the circuit unit 750d, extends along the part of the left or the right edge and the upper edge of the display area DA after passing through the bending region BDA, and is bent and is again returned to be connected to the circuit unit 750d via the bending region BDA, thereby having a reciprocating structure. The voltage transmitting line 177 may be positioned between the sensing wires M1 and M2 and the sensing wire M7 at the left side and the upper side of the display panel, and may be positioned between the sensing wires M3 and M4 and the sensing wire M8 at the right side and the upper side of the display panel. Accordingly, the sensing wires M1, M2, M3, and M4 may detect a crack that may be generated in the peripheral area PA outside with respect to the voltage transmitting line 177, and the sensing wires M7 and M8 may detect a crack that may be generated in the peripheral area PA inside with respect to the voltage transmitting line 177.

Referring to FIG. 18, sensing wires M9 and M10 may be positioned at the bending region BDA and the periphery thereof, and may be used to detect a defect such as a crack. The sensing wire M9 may be positioned at the left side and the sensing wire M10 may be positioned at the right side with respect to the center of the bending region BDA.

Both ends of each of the sensing wires M9 and M10 are connected to the circuit unit 750d. For example, both ends of each of the sensing wires M9 and M10 may be connected to the same side of the circuit unit 750d. Each of the sensing wires M9 and M10 starts from one end, extends along the part of the lower edge of the display area DA after passing through the bending region BDA, and is bent and is returned to be connected to the circuit unit 750d via the bending region BDA, thereby having a reciprocating structure. The number of reciprocations of one reciprocating structure may be one as shown, or may be plural. The part extending along the lower edge of the display area DA, among the sensing wires M9 and M10 is positioned between the display area DA and the bending region BDA.

Unlike the other sensing wires, the sensing wires M9 and M10 are primarily positioned in the bending region BDA. As a result, the sensing wires M9 and M10 are capable of sensing/detecting a defect generated in the bending region BDA such as a crack or lifting through the detected resistance change. Accordingly, the sensing wires M9 and M10 may have a smaller wire length than other sensing wires M1, M2, M3, M4, M7, and M8 extending along at least one edge of the periphery of the display area DA.

Alternatively, in an exemplary embodiment, one of the two sensing wires M9 and M10 may be omitted. In this case, one of the sensing wires M9 and M10 starts from one side of the circuit unit 750d, extends along the lower edge of the display area DA via the bending region BDA, and again passes through the bending region BDA to be connected to the other side of the circuit unit 750d.

Alternatively, in an exemplary embodiment, the sensing wires M9 and M10 may be primarily formed in only the bending region BDA. That is, in an exemplary embodiment, the sensing wires M9 and M10 are not formed in the portion extending along the lower edge of the display area DA on the bending region BDA.

In the bending region BDA, the sensing wire M7 may be positioned between the sensing wires M1 and M2 and the sensing wire M9, and the sensing wire M8 may be positioned between the sensing wires M3 and M4 and the sensing wire M10. Further, the voltage transmitting line 177 may be positioned between the sensing wires M1 and M2 and the sensing wire M7 in the left side of the bending region BDA, and the voltage transmitting line 177 may be positioned between the sensing wires M3 and M4 and the sensing wire M8 in the right side. However, exemplary embodiments are not limited thereto. For example, in an exemplary embodiment, the voltage transmitting line 177 may be positioned between the sensing wire M7 and the sensing wire M9 in the left side of the bending region BDA and may be positioned between the sensing wire M8 and the sensing wire M10 in the right side, and the voltage transmitting line 177 may be positioned between two sensing wires M9 and M10 in the bending region BDA.

A cross-sectional structure of the display device according to the present exemplary embodiment will now be described with reference to FIG. 20 and FIG. 21 along with FIG. 18 and FIG. 19. The cross-sectional structure is substantially the same as the cross-sectional structure of the previous exemplary embodiment shown in FIG. 2. For convenience of explanation, differences thereof will be described herein.

Figure 20:
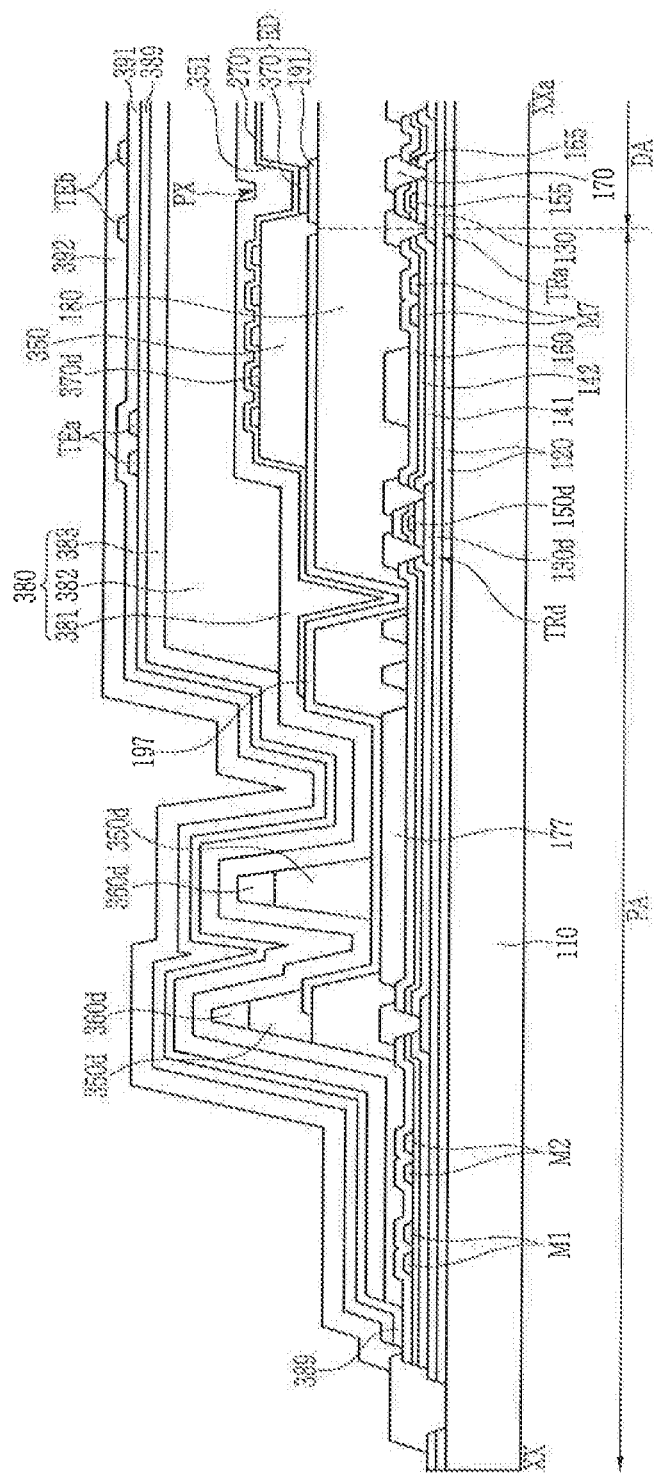
FIG. 20 is a cross-sectional view of the display device shown in FIG. 18 taken along line XX-XXa, according to an exemplary embodiment of the present disclosure.

Referring to FIG. 20, similar to the exemplary embodiment shown in FIG. 2, in the region except for the bending region BDA, the second conductive layer positioned between the second insulating layer 142 and the third insulating layer 160 may further include the sensing wires M7, M8, M9, and M10 as well as the sensing wires M1, M2, M3, and M4. However, the positions of the sensing wires M1, M2, M3, M4, M7, M8, M9, and M10 are not limited thereto. For example, at least one sensing wire from among the sensing wires M1, M2, M3, M4, M7, M8, M9, and M10 may be positioned at a different layer from second conductive layer. For example, at least one sensing wire may be positioned at the first conductive layer or the third conductive layer.

Figure 21:
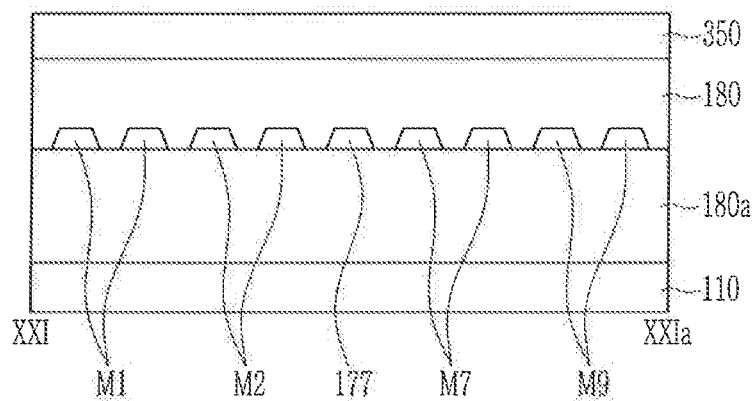
FIG. 21 is a cross-sectional view of the display device shown in FIG. 18 taken along line XXI-XXIa, according to an exemplary embodiment of the present disclosure.

Referring to FIG. 21, in the bending region BDA, the sensing wires M1, M2, M3, M4, M7, M8, M9, and M10 may be positioned in the third conductive layer in which the data line 171 and the voltage transmitting line 177 are positioned. In the region other than the bending region BDA, when the sensing wires M1, M2, M3, M4, M7, M8, M9, and M10 are positioned in a layer other than the third conductive layer, the sensing wires M1, M2, M3, M4, M7, M8, M9, and M10 may include at least one contact portion positioned at upper and lower peripheries of the bending region BDA, and two portions positioned at the different layers may be electrically connected through the contact portion. The contact portion may include, for example, a contact hole of an insulating layer positioned between two portions formed at the different layers from each other.

Referring to FIG. 20 and FIG. 21, a layer from among the insulating layer positioned on the substrate 110, a first insulating layer 141, a second insulating layer 142, and a third insulating layer 160 positioned under the third conductive layer may be removed in the bending region BDA, and an insulating layer 180a may be positioned on the substrate 110. The insulating layer 180a may include, for example, an organic insulating material. In an exemplary embodiment, the insulating layer 180a is not positioned in any regions other than the bending region BDA and the periphery thereof.

Figure 22:
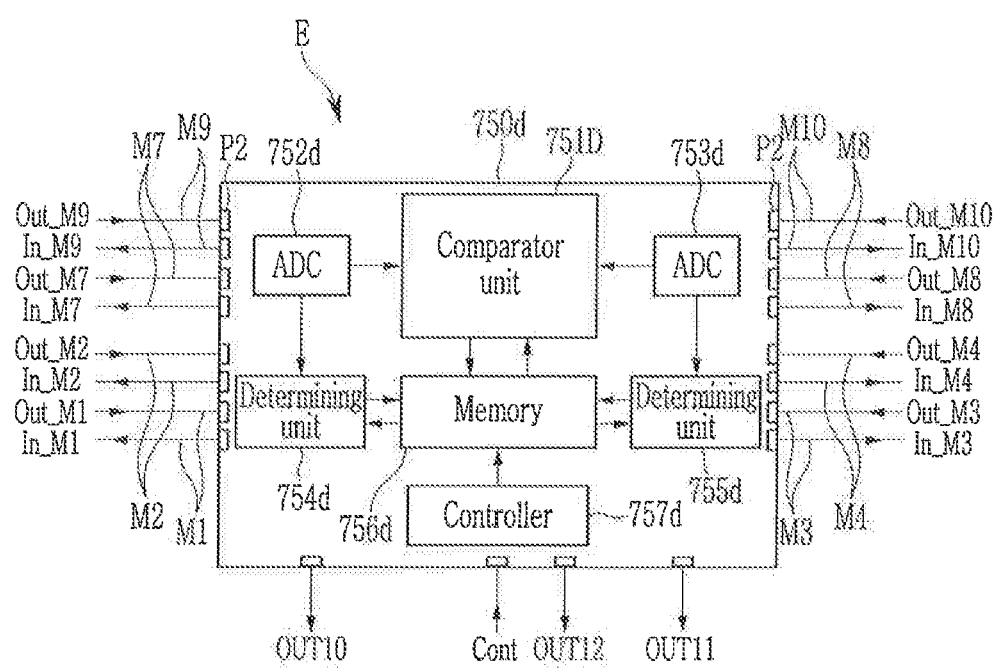
FIG. 22 is an enlarged view of portion E of the display device shown in FIG. 18, according to an exemplary embodiment of the present disclosure.

FIG. 22 is an enlarged view of a portion E of the display device shown in FIG. 18 according to an exemplary embodiment of the present disclosure.

Referring to FIG. 22, the structure of the circuit unit 750d positioned at the peripheral area PA and the periphery thereof is substantially the same as the previous exemplary embodiment shown in FIG. 3 to FIG. 5. For convenience of explanation, the differences thereof will be described herein.

The circuit unit 750d inputs the input signal In_M1, In_M2, In_M3, In_M4, In_M7, In_M8, In_M9, and In_M10 as the test signal to detect a defect such as a crack to one end of each of the sensing wires M1, M2, M3, M4, M7, M8, M9, and M10, and receives the output signals Out_M1, Out_M2, Out_M3, Out_M4, Out_M7, Out_M8, Out_M9, and Out_M10 from the other end of the sensing wires M1, M2, M3, M4, M7, M8, M9, and M10.

The circuit unit 750d includes a comparator unit 751D, a plurality of resistance detection units 752d and 753d, a plurality of determining units 754d and 755d, a memory 756d, and a controller 757d.

The resistance detection unit 752d detects the resistance of the sensing wires M1, M2, M7, and M9 based on the output signals Out_M1 and Out_M2, Out_M7, and Out_M9 of the sensing wires M1, M2, M7, and M9, and the resistance detection unit 753d detects the resistance of the sensing wires M3, M4, M8, and M10 based on the output signals Out_M3, Out_M4, Out_M8, and Out_M10 of the sensing wires M3, M4, M8, and M10. The resistance detection units 752d and 753d may respectively include, for example, at least one analog-digital convertor ADC that converts the output signals Out_M1, Out_M2, Out_M3, Out_M4, Out_M7, Out_M8, Out_M9, and Out_M10 from the sensing wires M1, M2, M3, M4, M7, M8, M9, and M10 into digital values. The resistance detection units 752d and 753d may output the detected resistance of each of the sensing wires M1, M2, M3, M4, M7, M8, M9, and M10 to the comparator unit 751D and the determining units 754d and 755d. The resistance detection units 752d and 753d may transmit the detected resistance of the sensing wires M1, M2, M3, M4, M7, M8, M9, and M10 to the memory 756*d* to be stored.

The determining unit 754*d* determines whether the resistance of each of the sensing wires M1, M2, M7, and M9 input from the resistance detection unit 752*d* is within the first predetermined range to output the determined result, and the determining unit 755*d* determines Whether the resistance of each of the sensing wires M3, M4, M8, and M10 input from the resistance detection unit 753*d* is within the first predetermined range to output the determined result. The determined result of the determining units 754*d* and 755*d* may be included in the output signals OUT10 and OUT11 to be output outside the circuit unit 750*d*, and the resistance of the sensing wires M1, M2, M3, M4, M7, M8, M9, and M10 may be stored in the memory 756*d* according to the determined result of the determining units 754*d* and 755*d*.

The comparator unit 751D may include one or a plurality of comparators. The comparator unit 751D compares the resistances of the sensing wires M1, M2, M3, and M4 from the resistance detection units 752*d* and 753*d* with each other to output the determined result. Further, the comparator unit 751D may receive and compare the results of the plurality of inspection operations from the memory 756 with each other to output the determined result. The comparison result may be included in the output signal OUT12 to be output outside the circuit unit 750*d* and to be stored in the memory 756*d*.

The controller 757*d* may receive the input control signal Cont from the outside similar to the above-described controller 757 to control each part of the circuit unit 750*d*, including, for example, the setting of the memory 756*d*.

The circuit unit 750*d* may include a plurality of pad portions P2 respectively bonded to the pad portions as terminals positioned at the ends of the sensing wires M1, M2, M3, M4, M7, M8, M9, and M10. The pad portions P2 may be respectively connected to the resistance detection units 752*d* and 753*d*, the determining units 754*d* and 755*d*, the comparator unit 751D, and the controller 757*d* as described above.

In the display device of the structure according to the present exemplary embodiment, the inspecting method that senses/detects a defect such as a crack is substantially the same as that described for the exemplary embodiment shown in FIG. 6 to FIG. 9. However, the sensing wires M7, M8, M9, and M10 are added such that the inspecting method related thereto is additionally described. For convenience of explanation, the inspecting method for the other sensing wires M1, M2, M3, and M4 is omitted in the following description, since the inspection may be performed as described above.

The inspecting method that senses/detects a defect such as a crack may include the first inspection operation S61 and the second inspection operation S62, and may compare the result (sensing wire resistance information) of the first inspection operation S61 with the result (sensing wire resistance information) of the second inspection operation S62 to determine a defect and the defect state of the display device. In addition to determining whether a defect such as the crack is generated in the display panel 1000*e*, the progress and the progress degree of the crack may also be determined. An additional inspection operation(s) (a third inspection operation, a fourth inspection operation, etc.) performed after the second inspection operation S62 may also be performed. The manner in which each inspection operation is performed may be substantially the same as each other.

The inspection result of each of the first inspection operation S61 and the second inspection operation S62 may include information including the resistance value of each of the sensing wires M7, M8, M9, and M10.

The circuit unit 750*d* inputs the input signals In_M7, In_M8, In_M9, and In_M10 to the plurality of sensing wires M7, M8, M9, and M10, and receives the output signals Out_M7, Out_M8, Out_M9, and Out_M10, respectively. The resistance detection units 752*d* and 753*d* of the circuit unit 750*d* detect the wire resistance of each of the sensing wires M7, M8, M9, and M10 based on the output signals Out_M7, Out_M8, Out_M9, and Out_M10, and the determining unit 754*d* determines whether the detected resistance is within the first predetermined range. The first predetermined range may be determined as the range of, for example, about −15 to +15% with respect to the center value (e.g., about 500 kΩ, 600 kΩ, 700 kΩ, etc.) of the resistance, but is not limited thereto. The first predetermined range may be stored in the memory 756*d*. If each wire resistance of the sensing wires M7, M8, M9, and M10 is within the first predetermined range, the sensing wire is determined to be in the normal wire state within the process dispersion range such that it may be determined to be good, otherwise it may be determined to be had.

The information for the resistances of the sensing wires M7, M8, M9, and M10 stored in the memory 756*d* in the first inspection operation S61 and the second inspection operation S62 may be compared to determine the progress of the crack and the progress degree. For example, the comparator unit 751D compares the detected resistances detected in the first inspection operation S61 with the second inspection operation S62. Based on this comparison, it is determined that the crack is not progressing when there is no resistance difference. Further, when the difference of the resistance is larger than 0 and is larger than the third predetermined range, it is determined that the progress degree of the crack is large. Further, when the difference of the resistance is larger than 0 and is smaller than the third predetermined range, the progress degree of the crack is small. The third predetermined range may be stored in the memory 756*d*.

Figure 23:
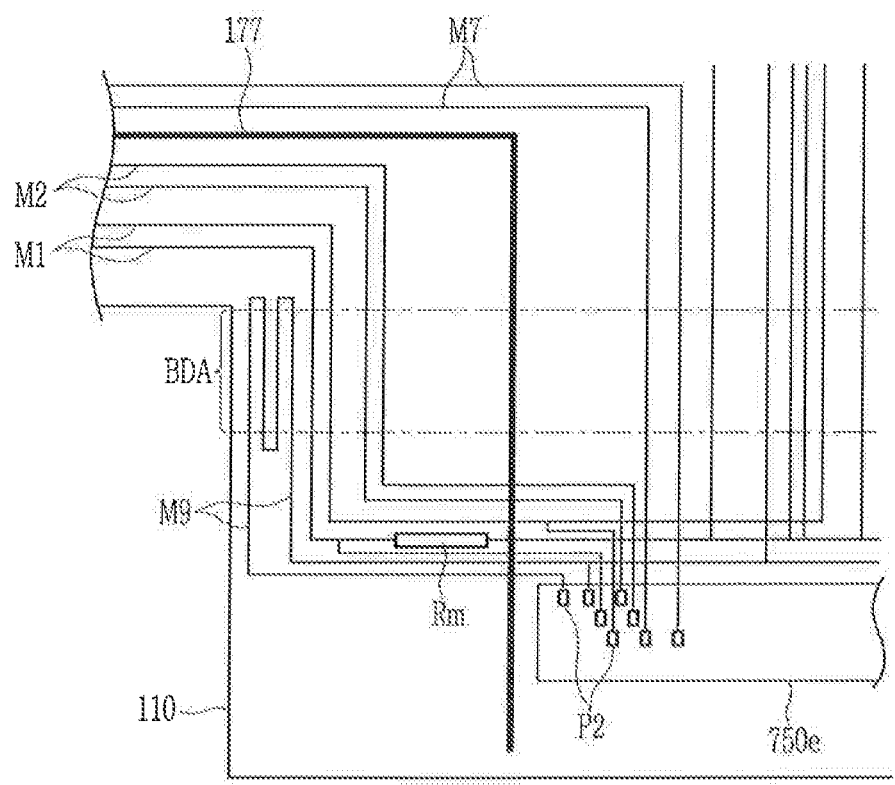
FIG. 23 is a layout view of a left portion of portion F of the display device shown in FIG. 18, according to another exemplary embodiment of the present disclosure.

FIG. 23 is a detailed layout view of a left portion of portion E of the display device shown in FIG. 18 according to an exemplary embodiment of the present disclosure.

Referring to FIG. 23, the display device according to the present exemplary embodiment is substantially the same as the previous exemplary embodiment shown in FIG. 18 to FIG. 21, however the position and the structure of the sensing wires M9 and M10 to detect the defect such as the crack is different.

The sensing wire M9 includes an end that starts from one end connected to a circuit unit 750*e*, extends in the bending region BDA, reciprocates at least once in the bending region BDA and/or the periphery, and is again returned to be connected to the circuit unit 750*e*. Similarly, the sensing wire M10 has substantially the same shape as the sensing wire M9, but is symmetrical with respect to the vertical center line of the display panel, and may also include an end that starts from one end connected to the circuit unit 750*e*, extends in the bending region BDA, reciprocates at least once in the bending region BDA and/or the periphery thereof, and is again returned to be connected to the circuit unit 750*e*, FIG. 23 shows an example in which the sensing wire M9 reciprocates two times in the bending region BDA and the periphery thereof. In an exemplary embodiment, the sensing wires M9 and M10 do not include a portion that is positioned in the peripheral area PA on the bending region BDA, but extends along the periphery of the display area DA.

The sensing wire M9 may be positioned between the left edge of the substrate 110 (or the display panel) and the sensing wire M1, and the sensing wire M10 may be positioned between the right edge of the substrate 110 (or the display panel) and the sensing wire M3.

A defect generated in the edge region of the bending region BDA, such as a crack or lifting, may be sensed/detected through the resistance change detection of the sensing wires M9 and M10.

The circuit unit 750e may include the pad portions P2 connected to each of the sensing wires M1, M2, M3, M4, M7, M8, M9, and M10. Referring to FIG. 23, the sensing wire M1 or other sensing wires M2, M3, and M4 may include a matching resistor Rm to compensate the wire resistance deviation between the sensing wires M1, M2, M3, and M4, or the sensing wires may be connected thereto.

The display device according to the exemplary embodiments described herein may be one of various display devices such as, for example, a liquid crystal display, an organic/inorganic emissive display device, etc.

While the present disclosure has been particularly described with reference to the exemplary embodiments thereof, it will be understood by those of ordinary skill in the art that various changes in form and detail may be made therein without departing from the spirit and scope of the present disclosure as defined by the following claims.

What is claimed is:

1. A display device, comprising:
a defect inspection circuit; and
a display panel comprising a substrate including a display area in which an image is displayed, and a peripheral area positioned outside the display area,
wherein the display panel comprises at least one sensing wire positioned in the peripheral area and connected to the defect inspection circuit,
wherein the at least one sensing wire comprises a first sensing wire and a second sensing wire,
wherein the first sensing wire comprises a first portion and a second portion, wherein the first portion of the first sensing wire extends along a first side of the display area, the first side of the display area opposes a first side of the substrate, and the first portion of the first sensing wire extends between the first side of the display area and the first side of the substrate and is longer than the first side of the display area,
wherein the second portion of the first sensing wire is connected to the first portion of the first sensing wire and extends along less than an entirety of a second side of the display area, and the second side of the display area is adjacent to the first side of the display area and opposes a third side of the display area,
wherein the defect inspection circuit is disposed adjacent to the third side of the display area,
wherein the second sensing wire comprises a first portion and a second portion,
wherein the first portion of the second sensing wire extends along a fourth side of the display area which opposes the first side of the display area,
wherein the second portion of the second sensing wire is connected to the first portion of the second sensing wire and extends along less than an entirety of the second side of the display area,
wherein an end of the second portion of the first sensing wire opposes an end of the second portion of the second sensing wire and does not contact the end of the second portion of the second sensing wire,
wherein the display area is disposed between the opposing ends and the defect inspection circuit,
wherein the defect inspection circuit comprises:
a resistance detection circuit that detects a resistance of the at least one sensing wire based on an output signal corresponding to the at least one sensing wire;
a memory that stores a first resistance information related to the resistance of the at least one sensing wire detected in a first inspection operation; and
a comparator circuit comprising a first comparator that compares the first resistance information with a second resistance information, wherein the second resistance information is related to the resistance of the at least one sensing wire detected in a second inspection operation that is performed at a different time than the first inspection operation.

2. The display device of claim 1, wherein
the defect inspection circuit comprises a pad portion that outputs a comparison result of the first comparator.

3. The display device of claim 2, wherein
the first resistance information and the second resistance information comprise a resistance value of the at least one sensing wire.

4. The display device of claim 2, wherein
the at least one sensing wire is one of a plurality of sensing wires, and
the first resistance information and the second resistance information comprise a resistance comparison value between the plurality of sensing wires.

5. The display device of claim 4, wherein
the first resistance information and the second resistance information comprise a resistance value of the plurality of sensing wires.

6. The display device of claim 4, wherein
the comparator circuit further comprises a second comparator that compares at least two resistances from among the plurality of sensing wires with each other to obtain the resistance comparison value.

7. The display device of claim 6, wherein
the plurality of sensing wires further comprises a third sensing wire positioned adjacent and parallel to a same side of the display area as the first sensing wire.

8. The display device of claim 6, wherein
at least one comparison result of the first comparator and the second comparator indicates a progress degree of a defect of the display device.

9. The display device of claim 1, wherein
the resistance detection circuit further comprises a determining circuit that determines whether a detected resistance of the at least one sensing wire is within a first predetermined range, and that outputs a determination result indicating whether a defect is present in the display device.

10. A display device, comprising:
a defect inspection circuit; and
a display panel comprising a substrate including a display area in which an image is displayed, and a peripheral area positioned outside the display area,
wherein the display panel comprises a plurality of sensing wires positioned in the peripheral area and connected to the defect inspection circuit,
wherein at least one of the plurality of sensing wires extends along the display panel adjacent and parallel to an entirety of at least one side of the display area, wherein the defect inspection circuit comprises:
a resistance detection circuit that detects a plurality of resistances of the plurality of sensing wires based on a plurality of output signals corresponding to the plurality of sensing wires; and
a comparator circuit comprising a first comparator that obtains a first resistance comparison value by comparing a first resistance of a sensing wire of the plurality of sensing wires and a second resistance of another sensing wire of the plurality of sensing wires,
wherein the sensing wire and the another sensing wire are disposed on a same side of the display area with each other such that the sensing wire is disposed between an edge of the substrate and the display area, and the another sensing wire is disposed between the sensing wire and the display area.

11. The display device of claim 10, further comprising:
a memory that stores the first resistance comparison value, wherein the first resistance comparison value is obtained in a first inspection operation.

12. The display device of claim 11, wherein
the comparator circuit further comprises a second comparator that compares the first resistance comparison value with a second resistance comparison value, wherein the second resistance comparison value is obtained in a second inspection operation performed at a different time than the first inspection operation.

13. The display device of claim 10, wherein
the resistance detection circuit comprises a pad portion that outputs an output signal of the comparator circuit.

14. The display device of claim 10, wherein
the display panel further comprises a voltage transmitting line positioned in the peripheral area, wherein the voltage transmitting line transmits a common voltage,
the plurality of sensing wires comprises a first sensing wire positioned between the voltage transmitting line and the display area, and
a first end and a second end of the first sensing wire are connected to the resistance detection circuit.

15. The display device of claim 10, wherein
the peripheral area of the display panel comprises a bending region that is bent or bendable and disposed between the display area and the defect inspection circuit, and the substrate is folded when the bending region is bent,
the plurality of sensing wires comprises a first sensing wire extending along a periphery of the display area, and a second sensing wire comprising a portion that is positioned at the bending region and that is shorter than the first sensing wire,
the second sensing wire detects a defect in the bending region,
a first end and a second end of the first sensing wire are connected to the resistance detection circuit, and
a first end and a second end of the second sensing wire are connected to the resistance detection circuit.

16. The display device of claim 15, further comprising:
a voltage transmitting line positioned in the peripheral area, wherein the voltage transmitting line transmits a common voltage,
wherein the first sensing wire and the second sensing wire are positioned in a same layer as the voltage transmitting line in the bending region.

17. The display device of claim 15, wherein
the second sensing wire is positioned between an edge of the display panel and the first sensing wire in the bending region.

18. A method of inspecting a display device for a defect, comprising:
storing, in a resistance detection circuit, a first resistance information related to a resistance of at least one sensing wire included in a plurality of sensing wires,
wherein the first resistance information is obtained in a first inspection operation,
the display device comprises a substrate including a display panel comprising a display area in which an image is displayed and a peripheral area positioned outside the display area, and the at least one sensing wire is disposed in the peripheral area of the display panel and is connected to the resistance detection circuit;
obtaining, by the resistance detection circuit, a second resistance information related to the resistance of the at least one sensing wire,
wherein the second resistance information is obtained in a second inspection operation performed at a different time than the first inspection operation,
wherein the first resistance information and the second resistance information comprise a resistance comparison value between a first sensing wire of the plurality of sensing wires and a second sensing wire of the plurality of sensing wires,
wherein the first sensing wire comprises a first portion and a second portion,
wherein the first portion of the first sensing wire extends along a first side of the display area, the first side of the display area opposes a first side of the substrate, and the first portion of the first sensing wire extends between the first side of the display area and the first side of the substrate and is longer than the first side of the display area,
wherein the second portion of the first sensing wire is connected to the first portion of the first sensing wire and extends along less than an entirety of a second side of the display area, and the second side of the display area is adjacent to the first side of the display area and opposes a third side of the display area,
wherein the resistance detection circuit is disposed adjacent to the third side of the display area, and
wherein the second sensing wire comprises a first portion and a second portion,
wherein the first portion of the second sensing wire extends along a fourth side of the display area which opposes the first side of the display area, the fourth side of the display area opposing a second side of the substrate, the first portion of the second sensing wire extending between the fourth side of the display area and the second side of the substrate and being longer than the fourth side of the display area,
wherein the second portion of the second sensing wire is connected to the first portion of the second sensing wire and extends along less than an entirety of the second side of the display area,
wherein an end of the second portion of the first sensing wire opposes an end of the second portion of the second sensing wire and does not contact the end of the second portion of the second sensing wire,
wherein the display area is disposed between the opposing ends and the resistance detection circuit; and
comparing, by the resistance detection circuit, the first resistance information with the second resistance information.

19. The method of claim 18, wherein
the first resistance information and the second resistance information comprise a resistance value of the at least one sensing wire.

20. The method of claim 18, further comprising:
obtaining the resistance comparison value in the first inspection operation or the second inspection operation by comparing at least two resistances from among the plurality of sensing wires.

21. The method of claim 18, further comprising:
determining a progress degree of the defect of the display device by comparing at least two resistances corresponding to the at least one sensing wire.

* * * * *